US012105120B2

(12) United States Patent
Levy

(10) Patent No.: US 12,105,120 B2
(45) Date of Patent: *Oct. 1, 2024

(54) FLUX GATE SENSOR CIRCUIT

(71) Applicant: Solaredge Technologies Ltd., Herzeliya (IL)

(72) Inventor: Yehuda Levy, Jerusalem (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,725

(22) Filed: Jan. 9, 2023

(65) Prior Publication Data

US 2023/0221354 A1    Jul. 13, 2023

Related U.S. Application Data

(63) Continuation of application No. 16/578,586, filed on Sep. 23, 2019, now Pat. No. 11,579,172.

(60) Provisional application No. 62/736,693, filed on Sep. 26, 2018.

(51) Int. Cl.
*G01R 15/18* (2006.01)
*G01R 19/00* (2006.01)

(52) U.S. Cl.
CPC ....... *G01R 15/185* (2013.01); *G01R 19/0092* (2013.01)

(58) Field of Classification Search
CPC .............. G01R 15/185; G01R 19/0092; G01R 15/202; H01F 27/24; H01F 27/28; H01F 27/402; H01F 38/00
See application file for complete search history.

(56) References Cited

U.S. PATENT DOCUMENTS

| 4,298,838 | A |   | 11/1981 | Akamatsu et al. |
| 4,309,655 | A |   | 1/1982 | Lienhard et al. |
| 4,314,200 | A |   | 2/1982 | Marek |
| 4,492,919 | A | * | 1/1985 | Milkovic ............. G01R 15/146 323/357 |
| 4,970,459 | A |   | 11/1990 | Germer et al. |
| 5,008,612 | A | * | 4/1991 | Otto ........................ H01F 38/32 323/356 |

(Continued)

FOREIGN PATENT DOCUMENTS

| CN | 101438173 A | 5/2009 |
| CN | 102810385 A | 12/2012 |

(Continued)

OTHER PUBLICATIONS

English machine translation of JP 2016-125863 (Year: 2016).*

(Continued)

*Primary Examiner* — Steven L Yeninas
(74) *Attorney, Agent, or Firm* — Banner & Witcoff, Ltd.

(57) ABSTRACT

A sensor circuit may comprise or otherwise be connected to a transformer. The transformer may comprise a primary winding and a secondary winding. The primary winding may be configurable and/or connectable to sense a current flow in the primary winding. A configurable circuit with an output may be connected to the input of a comparator circuit. The output of the comparator circuit and one or both of the input of the configurable circuit or the output of the configurable circuit may connect across the secondary winding.

19 Claims, 14 Drawing Sheets

(56) References Cited

U.S. PATENT DOCUMENTS

| | | | |
|---|---|---|---|
| 6,160,697 | A | 12/2000 | Edel |
| 6,316,939 | B1 | 11/2001 | Nakagawa et al. |
| 6,426,632 | B1 | 7/2002 | Clunn |
| 6,528,960 | B1 | 3/2003 | Roden et al. |
| 11,579,172 | B2 * | 2/2023 | Levy .................... G01R 15/202 |
| 2004/0140879 | A1 | 7/2004 | Schafer |
| 2005/0280409 | A1 | 12/2005 | Manzoli et al. |
| 2006/0226826 | A1 | 10/2006 | Teppan |
| 2007/0257663 | A1 | 11/2007 | Mende et al. |
| 2015/0042325 | A1 | 2/2015 | Snoeij et al. |
| 2015/0233977 | A1 * | 8/2015 | Platise ............... G01R 19/0092 324/117 R |
| 2017/0059627 | A1 | 3/2017 | Polley et al. |
| 2017/0115328 | A1 | 4/2017 | Seki et al. |
| 2018/0059148 | A1 | 3/2018 | Geisler et al. |

FOREIGN PATENT DOCUMENTS

| | | |
|---|---|---|
| DE | 10051138 A1 | 5/2002 |
| DE | 102012216553 A1 | 3/2014 |
| GB | 2546532 A | 7/2017 |
| JP | 2016125863 A * | 7/2016 |
| WO | 2012007195 A1 | 1/2012 |

OTHER PUBLICATIONS

Feb. 1, 20202—EP Search Report—EP 19199141.3.
Liu et al "Study on the low power consumption of racetrack fluxgate" Sensors and Actuators A: Physical, Elsevier BV, NL, vol. 130-131, Aug. 14, 2006.
Liu et al "Study on the low power consumption of racetrack fluxgate" Sensors and Actuators A: Physical, Elsevier BV, NL, vol. 130-131, Aug. 14, 2006, pp. 124-128, XP027935596, ISSN: 0924-4247.
Pei-Ming Wu: "Design optimization of a low-power micromachined fluxgate sensor using localized core saturation method"); 12th Biennial IEEE Conference On Electromagnetic Field Computation Apr. 30, 2006.
Oct. 1, 20213—European Search Report—EP 21168153.1.
"Sensor Signal Conditioning IC for Closed-Loop Magnetic Current Sensor," Texas Instruments, SBVS070B, Jun. 2006.
Pejovic, Predrag, "A Simple Circuit for Direct Current Measurement Using a Transformer," IEEE Transactions on Circuits and Systems—I: Fundamental Theory and Applications, vol. 45, No. 8, pp. 830-837, Aug. 1998.
Nov. 2, 2023—CN Office Action—CN App. No. 201910919777.0.

* cited by examiner

FLUX GATE SENSOR CIRCUIT

CROSS REFERENCE TO RELATED APPLICATIONS

This application is a continuation of U.S. application Ser. No. 16/578,586, filed Sep. 23, 2019, which claims priority to U.S. provisional application Ser. No. 62/736,693, filed Sep. 26, 2018, the entire contents of which are incorporated herein by reference.

BACKGROUND

In the sensing and measurement of electrical current, the current measured may range from picoamperes to tens of thousands of amperes. The design and selection of a current sensing circuit and a method used to measure current may consider many parameters. The parameters may include the magnitude of the current in the measurement, required accuracy in the measurement, bandwidth of the measurement, and level of electrical isolation in the measurement. A further parameter may be consideration of the cost and/or the physical size of a current sensing circuit. The current value measured may be directly displayed by an instrument or converted to an appropriate form for use by a monitoring or control system.

Fluxgate sensors (e.g., saturable inductor current sensors) may work on the same measurement principle as Hall-effect-based current sensors. The measurement principle being that the magnetic field created by a primary current may be detected by a specific sensing element. A possible difference between fluxgate sensors and Hall-effect-based current sensors is that a fluxgate sensor may use a magnetically saturable inductor core for the specific sensing element whereas a Hall-effect-based sensor in an air gap of a magnetic inductor core is the specific sensing element. Change in the saturation level of a saturable inductor may alter permeability of a magnetic core and, consequently, the inductance of the inductor. The value of saturable inductance may be high at low currents and low at high currents. Fluxgate sensors may rely on the property of different magnetic materials to exhibit a non-linear relationship between the magnetic field strength (H) and the flux density (B). Saturation is the state reached when an increase in applied external magnetic field (H) cannot increase the magnetization of a ferromagnetic and/or ferrimagnetic material further. Not being able to increase the magnetization may mean that the total magnetic flux density (B) substantially levels off.

SUMMARY

The following summary is a brief summary of some of the inventive concepts, which is presented for illustrative purposes only and not intended to limit or constrain the aspects and examples in the detailed description. One skilled in the art will recognize other novel combinations and features from the detailed description.

Illustrative aspects of the disclosure disclosed herein may be with respect to a circuit adaptable to be utilized as a current sensor. More specifically, some illustrative aspects of the disclosure may feature the implementation of a circuit that includes a transformer with a core onto which are made primary and secondary windings. The core may be made of, for example, one or more ferromagnetic and/or ferrimagnetic materials. The core may have a shape that includes cross sectional areas that are different for a first part of the core of the transformer that may be utilized for the sensing of current. The difference between the cross-sectional areas may be referred to as a 'bottleneck' of the core of the transformer. The maximal magnetic flux density ($\Phi_B$) is inversely proportional to the core area (Ae) and may be increased in the bottleneck of the core compared to the rest of the core. When the core starts to saturate, the inductance of the secondary winding may be decreased (e.g., sharply decreased) by virtue of the bottleneck. The decrease in inductance in turn may increase the slope of the current versus time characteristic of the core to produce a current peak through the secondary winding. The current peak through the secondary winding may be sensed and used to provide a readable indication of the level of the current sensed by the current sensor.

These and other features, aspects, and advantages of the present disclosure will become better understood with regard to the following description, claims, and drawings. The present disclosure may be illustrated by way of example, and not limited by, the accompanying figures. In the drawings, like numerals reference similar elements.

DETAILED DESCRIPTION

In the following description of various illustrative aspects of the disclosure, reference may be made to the accompanying drawings, which form a part hereof, and in which may be shown, by way of illustration, various embodiments in which aspects of the disclosure may be practiced. It will be understood that other embodiments may be utilized and structural and functional modifications may be made, without departing from the scope of the present disclosure.

By way of introduction, features of illustrative aspects of the disclosure may be directed to a system that may utilize circuitry adaptable to be utilized as a current sensor. A part of a circuit utilized to enable current sensing by the current sensor may include a transformer with a core onto which may be wound a primary winding and a secondary winding. A reduction in the core cross-sectional area in a section of the core may allow for sensitive measurement of AC current, DC current, or both AC and DC current by the current sensor. The reduction in the core cross-sectional area in a section of the core may further allow a range of sensitivity to currents between low levels of amperage to high levels of amperage. By non-limiting example, the range of sensitivity may be between milli Amperes (mA) to Amperes (A) or tens of Amperes. A potential lack of sensitivity (or reduced sensitivity), in either case of a single and/or two-part core, for example, may be compensated for by using a compensator such as a passive circuit. The compensator (e.g., passive circuit) may provide an increase in the excitation current, which may be alternating current (AC), through the secondary winding of the transformer. The increase in the excitation current may be achieved without a substantial increase in direct current (DC) and/or substantially zero DC current through the secondary winding of the transformer.

Figure 1:
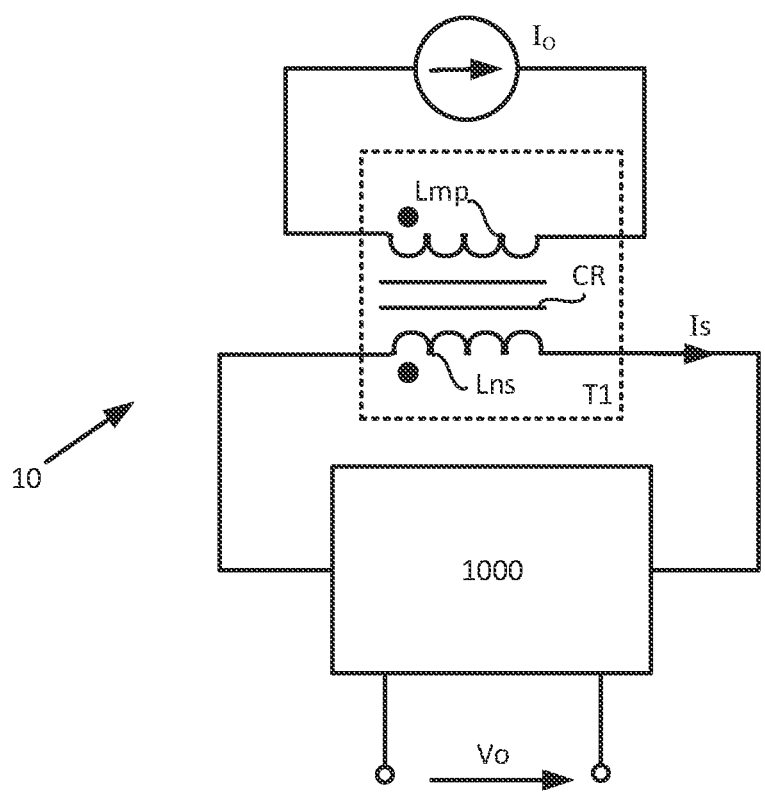
FIG. 1 shows a system which shows a connection of a transformer to a sensor circuit, according to illustrative aspects of the disclosure.

Reference is made to FIG. 1, which shows a system 10 which includes a connection of a transformer T1 to a sensor circuit 1000, according to illustrative aspects of the disclosure. System 10 and other alternative examples described below may be used to sense a current Io, which may flow through a primary winding Lmp of a transformer T1. A secondary winding Lns of transformer T1 may electromagnetically couple to primary winding Lmp via a core CR onto which both primary winding Lmp and secondary winding Lns may be wound. A secondary current Is may flow in secondary winding Lns and through sensor circuit 1000. A variety of materials can be used to manufacture core CR, examples may include solid iron, carbonyl iron, silicon steel, amorphous steel, ferrite ceramics, amorphous metals and laminated magnetic cores. Core CR may also be made from one or more ferromagnetic and/or ferrimagnetic materials. Examples of the ferromagnetic and/or ferrimagnetic materials may include one or more of iron, nickel, cobalt, manganese, zinc, and/or their alloys.

A control loop included in sensor circuit 1000 may generate a readable output voltage Vo. The readable output voltage Vo may be indicative of the current Io sensed by system 10. The current Io sensed by system 10 and described in greater detail below may be an alternating current (AC) and/or a direct current (DC). The circuitry of sensor circuit 1000 may be implemented using analogue circuitry and/or digital circuitry. Digital circuitry may include a microprocessor and interfaces which may include digital to analogue converters and analogue to digital converters. The microprocessor may run an algorithm to implement the control loop via the interfaces for example. The control loop may implement control functionality to provide a proportional (P) control, an integral (I) control and/or a derivative (D) control. The control functionality may therefore also provide a combined control functionality such as proportional (P) plus integral (I) control PI, proportional (P) plus derivative (d) control PD or PID for example.

Figure 1A:
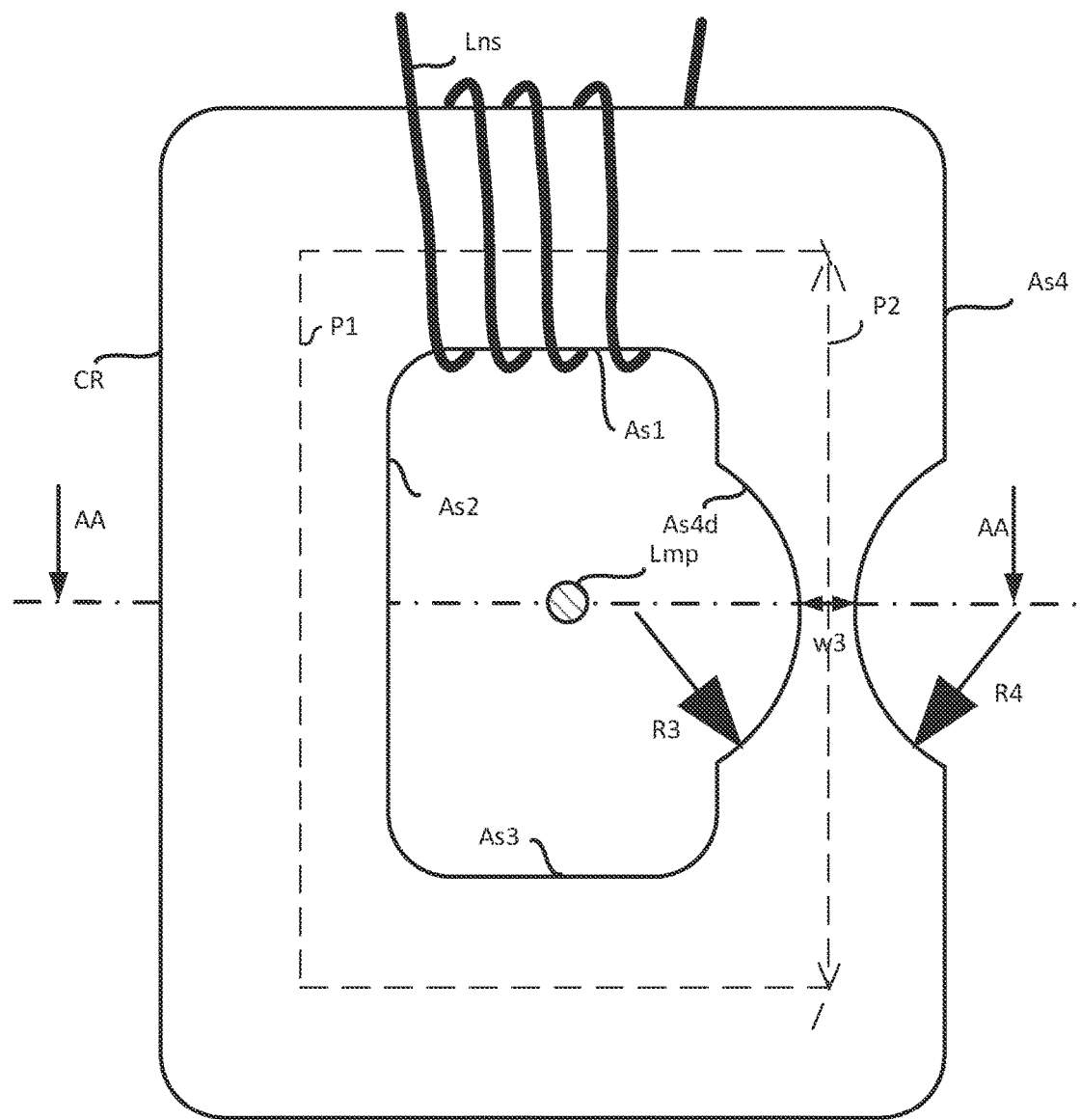
FIG. 1A shows a plan view and cross-sectional side view of an implementation of a transformer core, according to illustrative aspects of the disclosure.
Figure 1A:
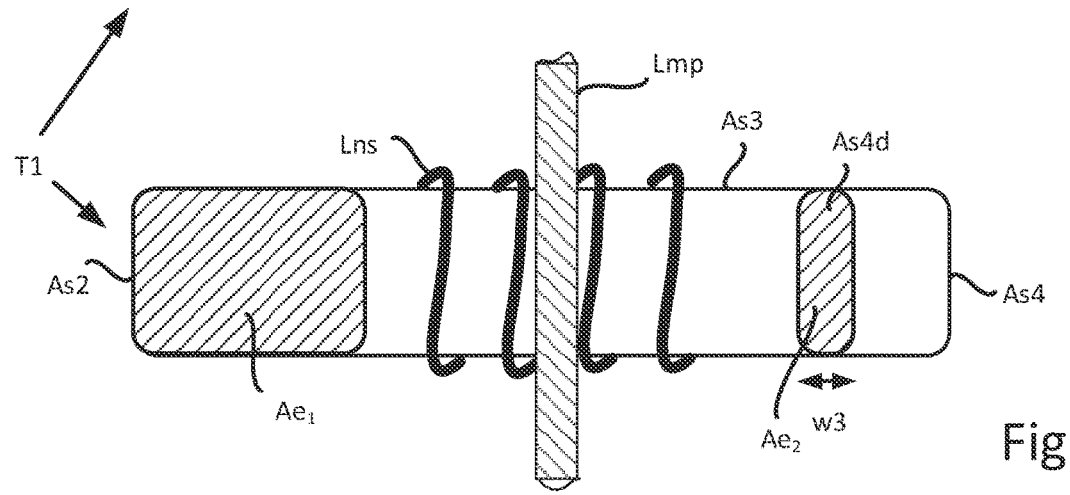

Reference is made to FIG. 1A, which shows a plan view and side cross sectional side view AA of an implementation of transformer T1, according to illustrative aspects of the disclosure. In the plan view, core CR is shown by way of example with a substantially rectangular shape. Core CR may be used to implement core CR in any of the figures herein and the descriptions which follow for the figures. In descriptions which follow, the core for transformer T1 may be any regular or irregular shape, such as substantially square, substantially elliptical, substantially spherical, substantially triangular, substantially pentagon-shaped, any substantially polygonal shape, or any non-polygonal shape, and may comprise one or more apertures. The core for transformer T1 may also be made of one part or more parts which are connectable together as descriptions which follow demonstrate.

Core CR may include a plurality of arms, such as four arms As1, As2, As3 and As4. Arm As4d may be included in arm As4. Secondary winding Lns is shown wound upon arm As1 but may be wound on As1, As2, As3, As4 and/or As4d. Primary winding Lmp is shown passing through the aperture formed by As1, As2, As3, As4 and As4d. The aperture(s) formed by As1, As2, As3, As4 and As4d may be any regular or irregular shape, such as substantially square, substantially elliptical, substantially spherical, substantially triangular, substantially pentagon-shaped, any substantially polygonal shape, or any non-polygonal shape. The side cross sectional view shows arm As2 with a substantially rectangular cross section, and arms As1, As3 and As4 may each have a similar rectangular cross section and/or may have a substantially square cross section. Arm As4 includes two radii R3 and R4 to form arm AS4d which may be considered a "bottleneck" area in arm AS4 of width w3. Radii R3 and R4 of arm As4d may be equal to each other or different. The lateral beginning of each radii may be such that width w3 of the bottleneck may be placed either symmetrically or asymmetrically in arm As4. The "bottleneck" might also not be completely rounded and may include straight sections, straight sections having rounded connection points (e.g., an hourglass shape or similar shape), or any other shape that allows a similar or different width at the "bottleneck" area.

Arm As4 also provides a second magnetic path P2 of core CR. The second magnetic path P2 may be shorter than a first magnetic path P1 which may include arms As1, As2 and As3. The cross-sectional area of arm As4d included in arm As4 may have a substantially rectangular cross section area Ae2 but may also be substantially elliptical, square, spherical, triangular, pentagon or any polygon shape. The rectangular cross section area Ae1 of arms As1, As2 and As3 may be bigger compared to rectangular cross section area Ae2 of arm As4d.

A difference may exist between cross-sectional areas of the second magnetic path P2 and the first magnetic path P1 (of a different length than the second magnetic path P2) of core CR of transformer T1. The first magnetic path P1 may have a larger cross-sectional area Ae1 and, for instance, a longer magnetic path length compared to the respective cross-sectional area Ae2 and magnetic path length of the second magnetic path P2. The second magnetic path P2 may be referred to as a 'bottleneck' area of core CR of transformer T1 (or the first magnetic path P1 may otherwise comprise the bottleneck area). The bottleneck area may be located where the cross-sectional area of the second magnetic path P2 of the core CR and the cross-sectional area of the first magnetic path P1 of core CR are substantially the same. However, the magnetic path length of the first magnetic path P1 may be longer than the second magnetic path P2, and the first magnetic path P1 may include a different ferromagnetic and/or ferrimagnetic material compared to that of the second magnetic path P2.

Figure 1B:
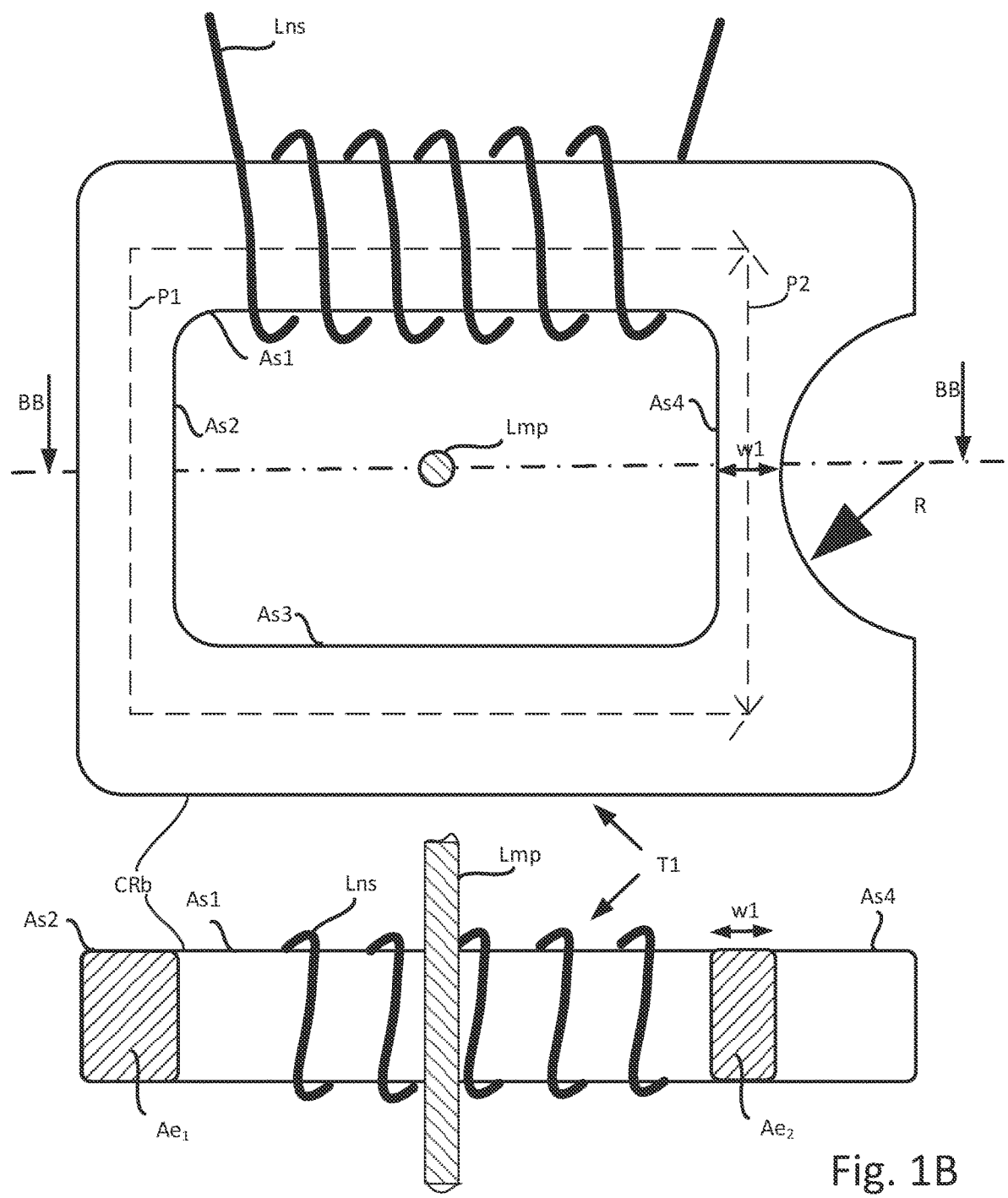
FIG. 1B shows a plan view and cross-sectional side view of an implementation of a transformer core, according to illustrative aspects of the disclosure.
Figure 2:
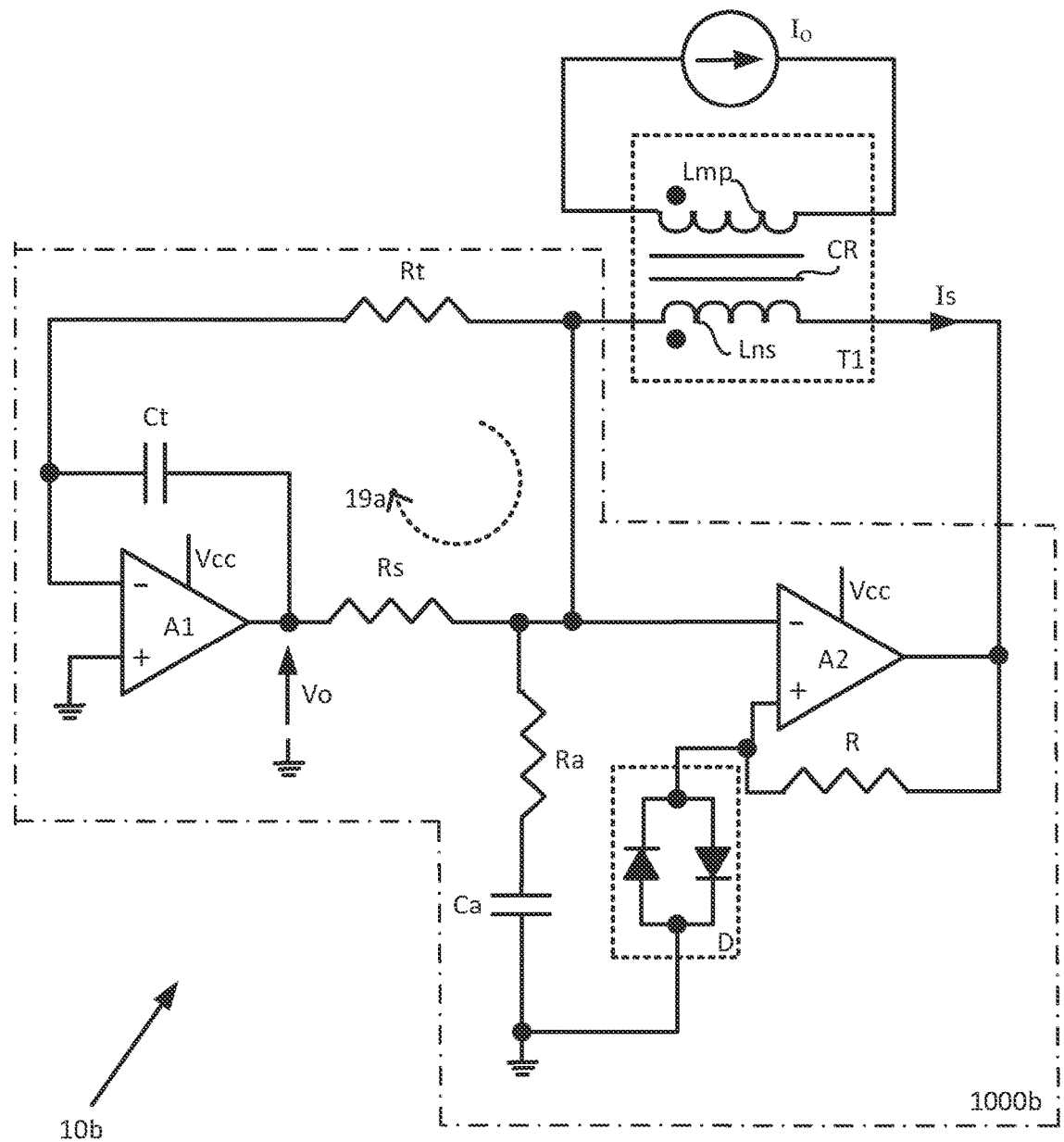
FIG. 2 shows a circuit diagram of a current sensor circuit, according to illustrative aspects of the disclosure.

Reference is made to FIG. 1B, which shows a plan view and side cross sectional side view BB of an implementation of transformer T1, according to illustrative aspects of the disclosure, such as transformer T1 of FIG. 1 or 2. In the plan view, core CRb is shown by way of example with a substantially rectangular shape. Core CRb may be used to implement core CR in any of the figures herein, such as in the circuits of FIG. 1 or 2. Core CRb may include a plurality of arms, such as four arms As1, As2, As3 and As4. Secondary winding Lns may be shown wound upon arm As1 but may be wound on As1, As2, As3 and/or As4. Primary winding Lmp is shown passing through the aperture formed by As1, As2, As3 and As4. The aperture(s) formed by As1, As2, As3 and As4 may be any regular or irregular shape, such as substantially square, substantially elliptical, substantially spherical, substantially triangular, substantially pentagon-shaped, any substantially polygonal shape, or any non-polygonal shape. The side cross sectional view shows arm As2 with a substantially rectangular cross section, and arms As2 and As3 may each have a similar rectangular cross section and/or may have a substantially square cross section. Arm As4 with respect to the plan view includes a narrowing of its cross section by a radius R compared to arms As1, As2 and/or As3. Arm As4 with respect to the cross-sectional side view of core CRb includes a reduction in width w1 compared to arms As1, As2 and As3. Arm As4 also provides a second magnetic path P2 of core CRb. The second magnetic path P2 may be shorter than a first magnetic path P1 which may include arms As1, As2 and/or As3. Secondary winding Lns may be wound in the first path P1 where core CRb includes a portion thereof having a reduction in width w1 compared to the widths of arms As1, As2 and As3. The cross section of arm As4 may have a substantially rectangular cross section but may also be substantially elliptical, square, spherical, triangular, pentagon or any polygon shape.

Figure 1C:
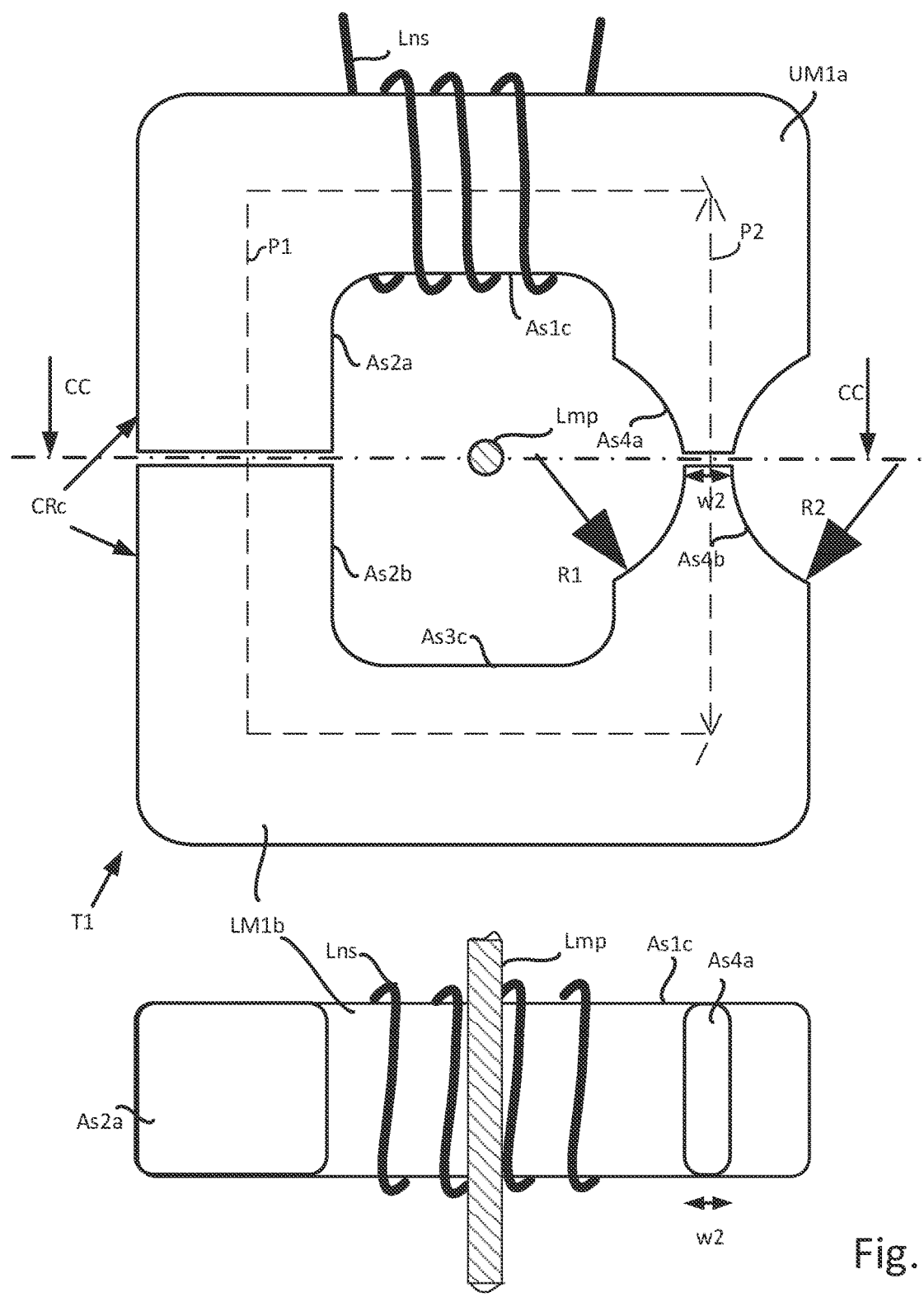
FIG. 1C shows a plan view and cross-sectional side view of an implementation of a transformer core, according to illustrative aspects of the disclosure.

Reference is made to FIG. 1C, which shows a plan view and side cross sectional side view CC of an implementation of transformer T1, according to illustrative aspects of the disclosure. Core CRc may be used to implement core CR in any of the figures herein, such as in the circuits of FIG. 1 or 2. Core CRc is shown by way of example as a two-part core with a substantially square shape, however core CRc may be of any shape and may have any number of a plurality of parts, such as more than two parts. Lower member LM1b may be attached to upper member UM1a, such as by an adhesive and/or other attachment mechanism which clamps lower member LM1b to upper member UM1a. The aperture formed by As1c, As2a, As2b, As3c, As4a and As4b may be substantially square as shown, although the aperture may be of any regular or irregular shape, such as substantially elliptical, substantially spherical, substantially triangular, substantially pentagon-shaped, substantially any polygonal shape, or any non-polygonal shape. Secondary winding Lns is shown wound upon arm As1 but may be wound on arms As1c, As2a, As2b, As3c and/or As4a/As4b. The Primary winding Lmp may be shown passing through the aperture formed by As1c, As2a, As2b, As3c, As4a and As4b. When lower member LM1b is attached to upper member UM1a, arms As4a and As4b form a second path P2 and arms As1c, As2a, As2b, As3c form a first path P1. When lower member LM1b is attached to upper member UM1a, arms As4a and As4b form the bottleneck of core CRc.

The side cross sectional view shows arm As2a having a substantially square cross section, and arms As2a and As1c may have a similar square cross section and/or may have a substantially rectangular cross section. The plan view shows a narrowing of the cross section of arms As4a and As4b compared to arms As1c, As2a, As2b and/or As3c by radii R1 and R2. Radii R1 and R2 may be equal and/or may be greater radii compared to radius R of core CRb. Arms As4a and As4b may also present a second magnetic path P2 of core CRc which has less length when compared to the first magnetic path P1 which may include arms As1c, As2a, As2b and/or As3c. Secondary winding Lns may be wound in the first path P1 where core CRc includes a reduction of width w2 compared to the widths of arms As1c, As2a, As2b and As3c.

Arms As4a/As4b may feature a reduction of width w2 compared to the widths arms As1c, As2a, As2b and As3c. Width w2 may be shown symmetrically located in arms As4a and As4b. The lateral beginning of each radii may be such that width w2 of the bottleneck may be placed asymmetrically in arms As4a and As4b. The cross section of arms As4a and As4b may be with substantially rectangular cross section as shown but may also be substantially, substantially square, substantially spherical, substantially triangular, substantially pentagon and/or any polygon shape.

Figure 1D:
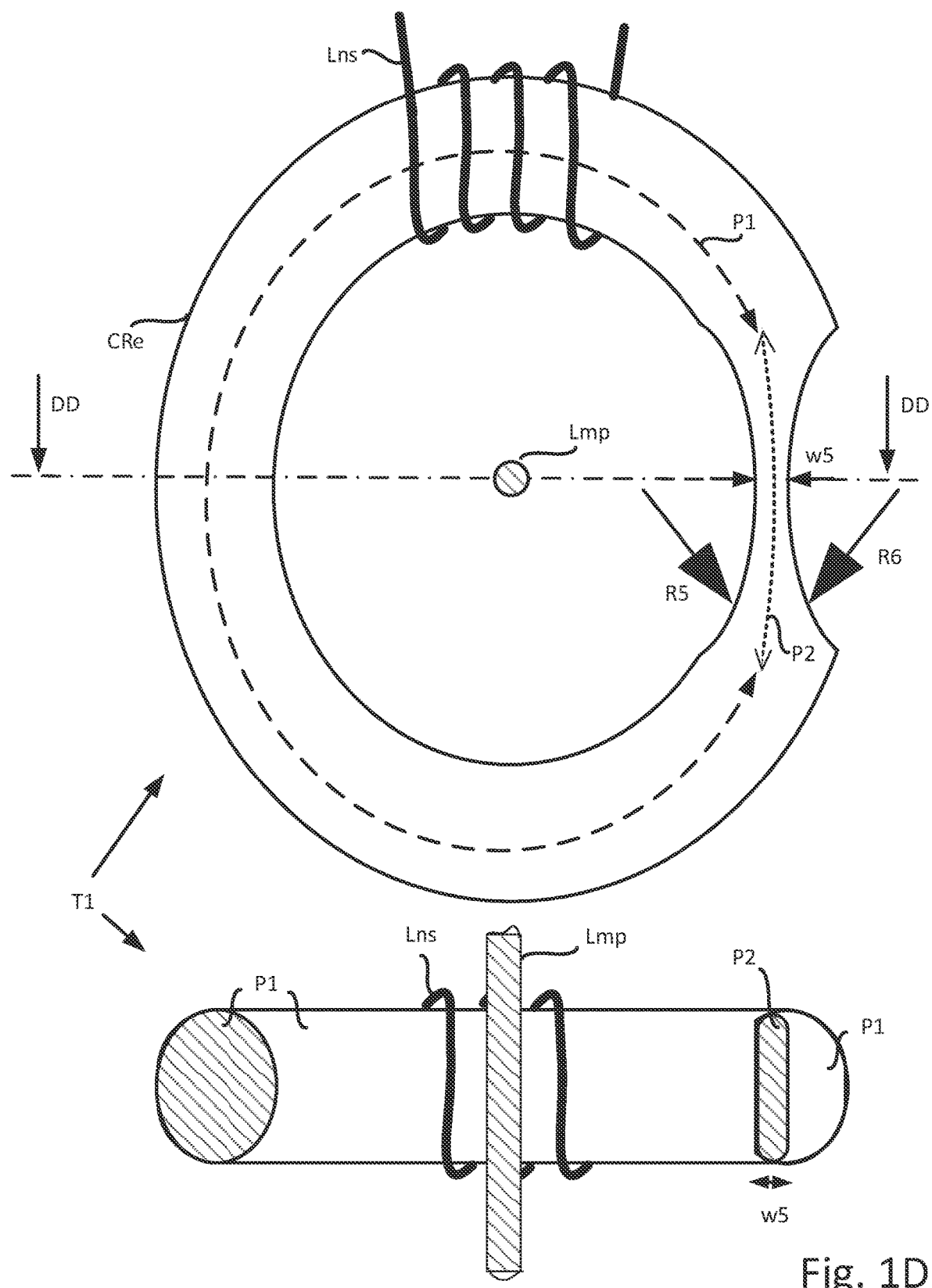
FIG. 1D shows a plan view and cross-sectional side view of an implementation of a transformer core, according to illustrative aspects of the disclosure.

Reference is made to FIG. 1D which shows a plan view and side cross sectional side view DD of an implementation of transformer T1 that includes a core CRe, according to illustrative aspects of the disclosure. Core CRe may be an example of a toroidal type of magnetic core, which in this case has an elliptical shape for core CRe, aperture of core CRe and the cross-sectional area of core CRe. Core CRe may include a longer magnetic path P1 compared to a shorter magnetic path P2 which includes the bottleneck of core CRe. Cross section DD shows the width w5 of the bottleneck of path P2 compared to the cross section of path P1. Secondary winding Lns may be shown wound around path P1 and primary winding Lmp passing through the aperture of core CRe. Secondary winding Lns may be wound around path P1 or path P2. The bottleneck may be by virtue of radii R5 and R6 which may have equal or different radii. The lateral starting positions of the radii may make width w5 of the bottleneck to be placed symmetrically or asymmetrically in core CRe. Width w5 placed asymmetrically may be laterally to the left or right with respect to the cross-sectional area of core CRe in the plan view.

Figure 1E:
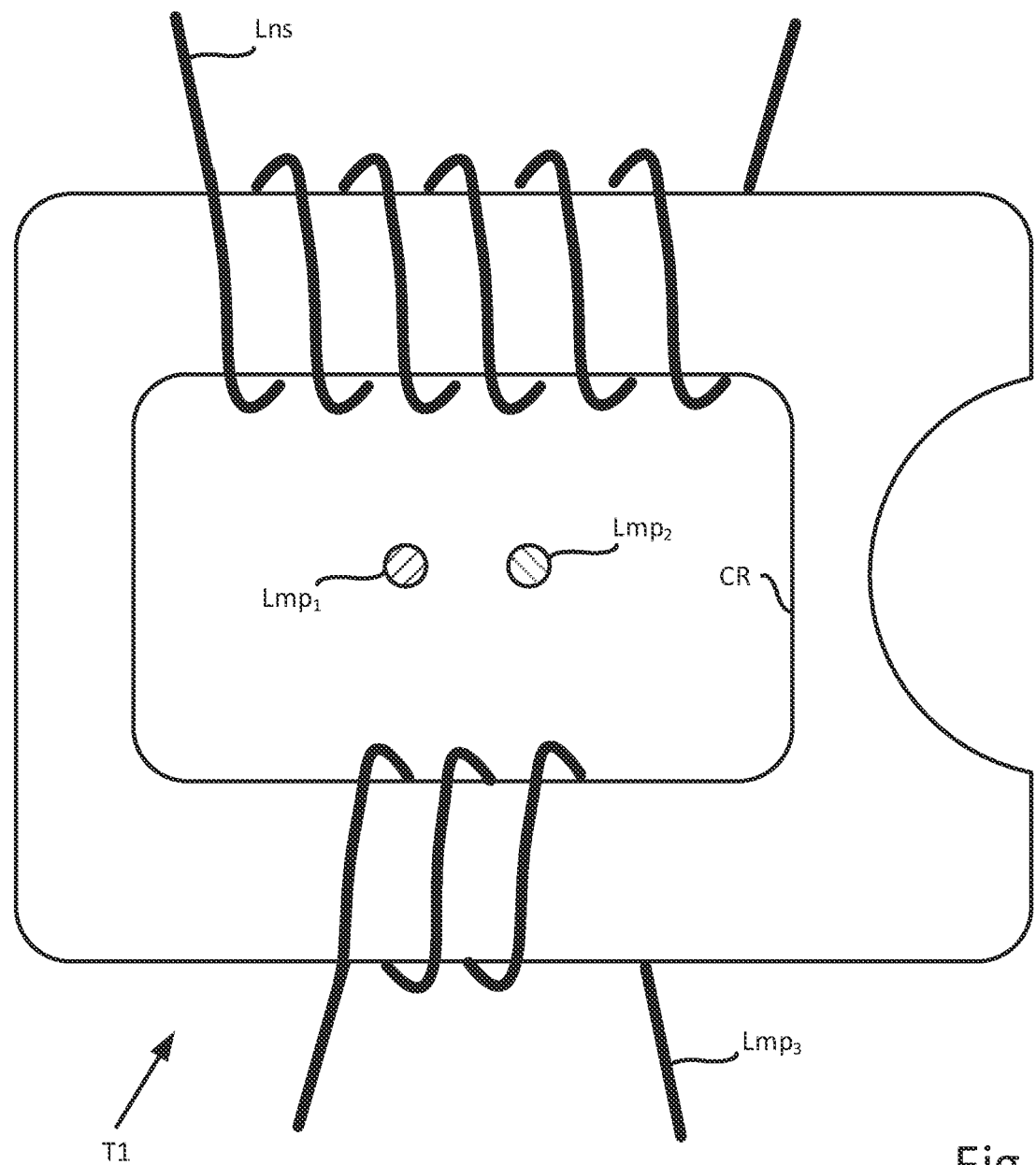
FIG. 1E shows one or more primary windings of a core such as the cores of circuits of FIG. 1 or 2, according to illustrative aspects of the disclosure.

Reference is made to FIG. 1E, which shows one or more primary windings of a core such as cores CR of the example circuits of FIG. 1 or 2, according to illustrative aspects of the disclosure. Secondary winding Lns has multiple windings shown wound around core CR. More than one secondary winding Lns may be wound around core CR where each one may have the same number of windings or each one may have different numbers of windings. Three primary windings $Lmp_1$, $Lmp_2$ and $Lmp_3$ are shown. The number of windings of the primary windings may be by a single insertion. For example, primary windings $Lmp_1$ and $Lmp_2$ are shown as single insertions through the aperture of core Cr. The single insertion as shown in the descriptions that follow count as one turn. Primary winding $Lmp_3$ is shown with three turns. Sensed currents $Io_1$, $Io_2$ and $Io_3$ may correspond respectively to primary windings $Lmp_1$, $Lmp_2$ and $Lmp_3$ may be direct currents (DC) and/or alternating currents (AC). System 10 may be configurable such that one or more 'q' primary windings $Lmp_q$ with respective currents $Io_q$ may be measured. More than one cable may be inserted and wound around core CR once or many times, either of which may allow multiple current sensing for each of the multiple primary windings $Lmp_q$. Currents $Io_q$, which may include differential currents and/or common mode currents as well as measurement of current in a single conductor, may be measured.

Figure 1F:
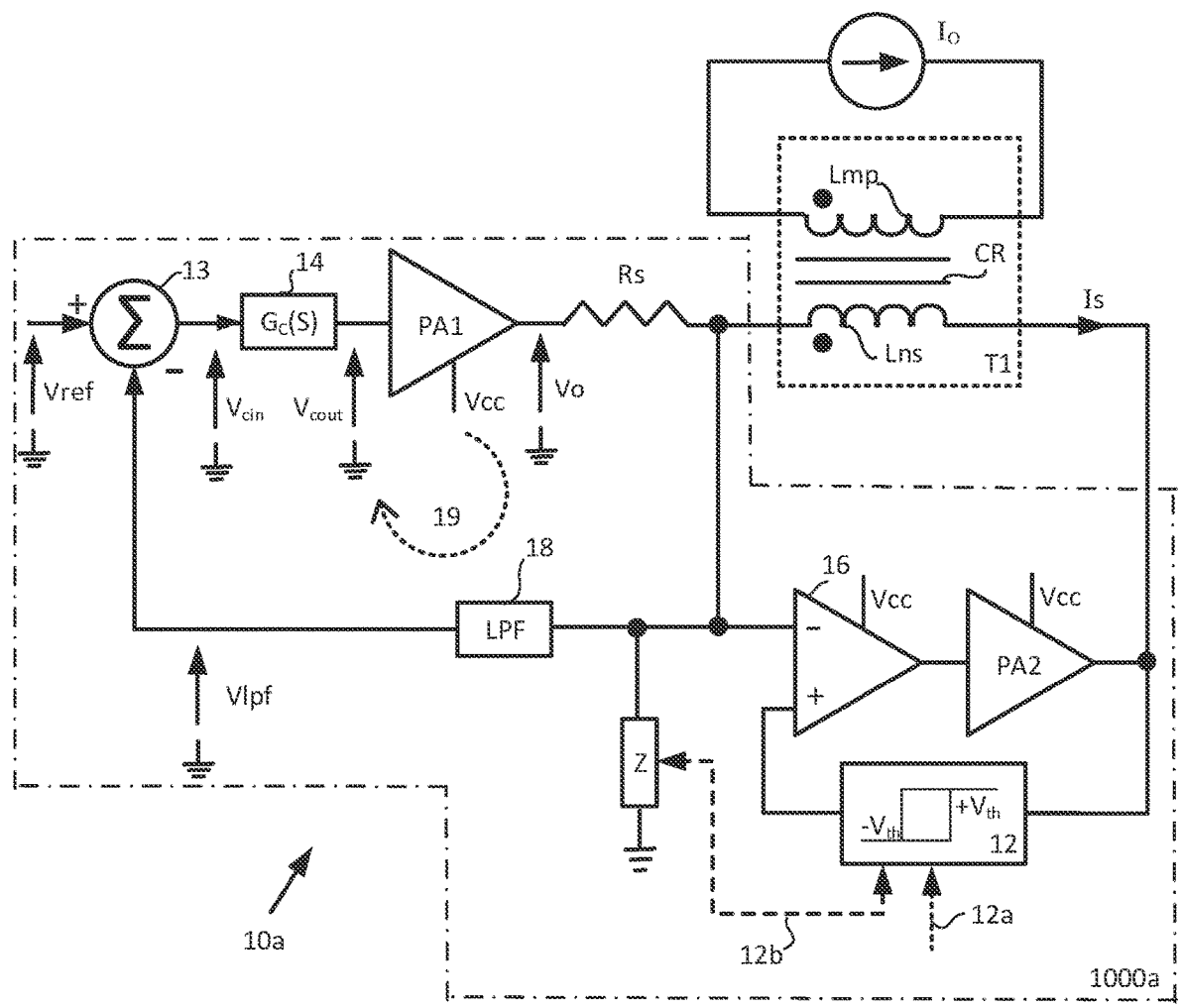
FIG. 1F shows a partial block/schematic diagram of a system, according to illustrative aspects of the disclosure.

Reference is made to FIG. 1F, which shows a partial block/schematic diagram of a system 10*a*, according to illustrative aspects of the disclosure. System 10*a* may be an example of system 10 as shown in FIG. 1. System 10*a* includes a sensor circuit 1000*a* which may be an example of sensor circuit 1000 shown in FIG. 1. By way of non-limiting example, systems as described herein may utilize a closed negative feedback loop. Alternatively, or additionally, systems described below may utilize other configurations such as a double loop feedback or an open feedback loop.

As described above with respect to transformer T1, a difference may exist between cross-sectional areas of a first magnetic path P1 and a second magnetic path P2 (of a different length than the first magnetic path) of core CR as described above and below. The second magnetic path P2 may have a smaller cross-sectional area and, for instance, a shorter magnetic path length compared to the respective cross-sectional area and magnetic path length of the first magnetic path P1. The second magnetic path P2 may be referred to as a 'bottleneck' area of core CR of transformer T1 (or the second magnetic path P2 may otherwise comprise the bottleneck area). Alternatively, or in addition, a bottleneck area may be made in core CR. The bottleneck area may be located where the cross-sectional area of the first magnetic path of the core CR and the cross-sectional area of the second magnetic path of core CR are substantially the same. However, the magnetic path length of the second magnetic path P2 may be shorter than the first magnetic path P1, and the second magnetic path P2 may include a different ferromagnetic and/or ferrimagnetic material compared to that of the first magnetic path P1.

Various circuitry connected with transformer T1 is now described by way of example. While certain circuit elements are shown in this figure, the circuitry of FIG. 1F may be alternatively implemented using other analogue circuit elements and/or digital circuit elements, such as one or more integrated circuits, ASICS, and/or processors, and/or memory storing instructions that can be executed by the one or more processors to perform any of the functionality of the circuitry of FIG. 1F. In the circuitry according to FIG. 1F, a reference voltage Vref may be fed into a positive terminal (+) of a summing junction 13. A closed feedback loop 19 may be formed between the output of summing junction 13 and the negative terminal (−) of summing junction 13. The feedback loop may comprise transfer function block 14, power amplifier PA1, and resistor Rs. The negative terminal (−) of summing junction 13 may connect to the output of low pass filter (LPF) 18 to receive voltage Vlpf on the negative terminal (−) with respect to ground. The output of summing junction 13 gives an error voltage $V_{cin}$ which connects to the input of transfer function block 14. The output voltage of transfer function block 14 is $V_{cout}$. Transfer function block 14 may be used to stabilize closed feedback loop 19 by way of providing a compensation function to make the level of error voltage $V_{cin}$ substantially zero volts.

The compensation function representing the operation of transfer function block 14 may be expressed by a function $G_c(S)$, where S is the Laplacian operator. An integration (I) operation may be performed by transfer function block 14 on the output of summing junction 13, such that the transfer function implemented by transfer function block 14 may be expressed mathematically as, for example:

$$G_c(S) = \frac{1}{T_i S} = \frac{V_{cout}}{V_{cin}}$$

Where in Function $G_c(S)$, $T_i$ is the integral time constant. Error voltage $V_{cin}$ is the difference between reference voltage Vref and the output voltage $V_{lpf}$ of low pass filter 18.

$$V_{cin} = Vref - Vlpf$$

The difference may be enabled by summing junction 13.

Alternatively, or in addition, function $G_c(S)$ may realize a proportional integral (PI) control function. The PI function for the transfer function implemented by transfer function block 14 may be expressed mathematically as, for example:

$$G_c(S) = K_p + \frac{1}{T_i S}$$

Where $K_p$ is the proportional gain constant and $T_i$ is the integral time constant. Included in the proportional gain constant $K_p$ may be the circuit design selection of the gain of power amplifiers PA1 and/or PA2 for example.

Alternatively, or in addition, function $G_c(S)$ may realize a proportional, integral and derivative (PID) control function. The PID control function for that the transfer function implemented by transfer function block 14 may be expressed mathematically as, for example:

$$G_c(S) = K_p + \frac{1}{T_i S} + T_d S$$

Where $K_p$ is the proportional gain constant, $T_i$ is the integral time constant, and $T_d$ is the derivative time constant. The derivative time constant may be the circuit design selection of difference amplifier 16, passive circuit Z, power amplifier PA2 and hysteresis unit 12. Details will be described below.

The output of transfer function block 14 may connect to the input of power amplifier PA1. The output of power amplifier PA1 may provide the output voltage Vo of system 10. The output of power amplifier PA1 may connect to a first end of a sensing shunt resistor Rs. Shunt resistor Rs may be selected to have an accurate and/or precise resistance by using a resistor having a low percentage or tolerance of error in the resistance of resistor Rs. A second end of resistor Rs may connect to a first end of secondary winding Lns, the inverting terminal (−) of difference amplifier 16, a first end of passive circuit Z (e.g., a passive circuit and/or a resistive circuit), and the input of LPF 18. A second end of circuit Z may connect to a fixed potential such as ground. A second end of secondary winding Lns may connect to the output of power amplifier PA2. The input of power amplifier PA2 may connect to the output of difference amplifier 16. The output of power amplifier PA2 may be fed back to the non-inverting input (+) of difference amplifier 16 via hysteresis unit 12, which may be controllable or otherwise configurable via control line 12*a*.

Hysteresis unit 12 may include a processor, memory operatively connected to the processor, and a communications interface. System 10 may, for example, be connected to the inter-connected power system to sense currents in the inter-connected power system when passive circuit Z may be set at a fixed value. A further potential feature of passive circuit Z is that passive circuit Z may additionally be configured to be adjustable. Passive circuit Z may be adjusted, for example, in the time periods where system 10 is not being utilized, to sense current Io which may flow through primary winding Lmp of transformer T1. The adjustment to passive circuit Z may take into consideration that the loop comprising difference amplifier 16, power amplifier PA2 and hysteresis unit 12 (configurable via control line 12a) may together implement a comparator. Control line 12a may be operably connected to a microprocessor which runs a control algorithm. The free running frequency (fsw) of such a comparator may be determined by threshold voltages ±Vth that are set by hysteresis unit 12. The free running frequency (fsw) may be determined in accordance with, for example, the following equation for the free running frequency (fsw):

$$fsw = \frac{Rs \times Vcc}{4 \times Vth \times Lm}$$

Where Lm is the magnetizing inductance of core CR and Vcc is the supply voltage of system 10.

Altering threshold voltages ±Vth that are set by hysteresis unit 12 may be alterable in the time periods where system 10 might not be utilized to sense current Io. In the time periods where system is not utilized to sense current Io, altering threshold voltages ±Vth may be utilized to allow transmission and reception of communication signals to and from power lines connected to system. Communication signals to and from power lines of the inter-connected power system connected to system 10, via transformer T1 may be an example of power line communications (PLCs). Altering threshold voltages ±Vth may vary the free running frequency (fsw) according to the equation above. Altering threshold voltages ±Vth may allow the comparator to function as a voltage-controlled oscillator (VCO). Therefore, the comparator (in this case, VCO) may be used as a modulation/demodulation loop, summing junction 13 may be utilized as a phase detector, LPF 18 may be used as the modulation loop filter, and the comparator may be used as the VCO. The VCO may therefore enable frequency modulation (FM) and frequency demodulation of a baseband signal, where the voltage levels of the baseband signal vary the free running frequency (fsw). The baseband signal may be representative of a sensed physical parameters such as temperatures, light intensities and power levels sensed by sensors of the inter-connected power system.

Hysteresis unit 12 may further include sensors and a sensor interface to sense one or more other parameters (e.g., the temperature of core CR), in order to compensate for those measured parameters. For example, hysteresis unit 12 may measure the temperature of core CR (using a temperature sensor) to compensate for temperature variations in the measurement of sensed current Io. Passive circuit Z may provide a higher current in transformer T1 in the AC path that will not significantly contribute to the DC current path of transformer T1. Passive circuit Z may also enable substantially zero DC current in the DC current path during a sensing of current Io when transfer function 14 and power amplifier PA1 provide an integral function. The integral function acts so as to restore the average voltage on resistor Rs to substantially zero. Substantially zero voltage on resistor Rs means substantially zero DC current in the DC current path. Substantially zero voltage on resistor Rs develops a readable output voltage, Vo. Voltage Vo reflects the amount of voltage needed to cancel the perturbing added primary flux of primary winding Limp. Voltage Vo is proportional to resistor Rs and inversely proportional to the number of turns "n" of secondary winding Lns.

In an example operation of system 10, for sensing current Io, secondary current Is through secondary winding Lns may start to flow and the flux (Φ) through core CR increases accordingly. Secondary current Is through secondary winding Lns may change linearly or non-linearly with respect to time and the flux (Φ) through core CR may increase accordingly. In general, the maximal magnetic flux density ($\Phi_B$) for a core of uniform cross section is inversely proportional to the core CR area Ae (rectangular cross section area Ae1 shown in FIG. 1A may be an example of a uniform cross section Ae). The relationship between the magnetic flux density (B), flux (Φ) and core cross section (Ae), inductance (L) of N turns and the current (I) is shown in the following equation:

$$B = \frac{\Phi}{A_e} = \mu_m \left[ \frac{I \times N}{L} \right]$$

Where $\mu_m$ is the relative permeability of the core.

The maximal magnetic flux density (FB) may be at maximum in the bottleneck area of core CR relative to the remaining part of core CR. When core CR starts to saturate at the bottleneck area of core CR, the inductance of secondary winding Lns may sharply decrease. The sharp decrease of the inductance of secondary winding Lns may in turn cause an increase in the slope of the secondary current Is versus time to result in a current peak through secondary winding Lns.

As discussed previously, difference amplifier 16, power amplifier PA2 and hysteresis unit 12 (configurable via control line 12a) may together operate as a comparator. Hysteresis unit 12 may provide a symmetrical threshold setting of the comparator and may increase sensitivity of the circuit to current. The slope of secondary current Is versus time through the secondary winding Lns may be sensed by measuring voltage across resistor Rs, which may serve as a shunt resistor to the input of the comparator. The loop comprising difference amplifier 16, power amplifier PA2 and hysteresis unit 12 may together to implement the comparator. The output of the comparator is the output of power amplifier PA2. A voltage VRs may be defined as the product of secondary current Is and the resistance of resistor Rs. When voltage VRs reaches the threshold ±Vth, the comparator may change its output sharply and the current through the secondary winding Lns may change in the same manner but with the opposite direction of current flow. In this way, the comparator may oscillate at a free running frequency (fsw). The free running frequency (fsw) which may be set in accordance with threshold voltages ±Vth, which in turn are set by hysteresis unit 12. Included in the setting of the free running frequency (fsw) may also be consideration of the supply voltage (Vcc) and transformer construction (e.g., the magnetizing inductance of the transformer core CR) described in greater detail below. As discussed previously, the setting of the free running frequency (fsw) may be established with respect to an equation to calculate the free running frequency (fsw), such as:

$$fsw = \frac{Rs \times Vcc}{4 \times Vth \times Lm}$$

When no current Io is measured flowing through primary winding Lmp, the average voltage developed on resistor Rs may be substantially zero. Core CR flux density may saturate freely between +Bsat to −Bsat at a substantially symmetrical duty cycle of 50% (although an asymmetric duty cycle may be possible). The symmetrical duty cycle may occur where the saturation of the core CR may be symmetric in magnitude so that the average current via resistor Rs may be essentially zero. Once a perturbing (measured) current Io may be injected to the primary winding Lmp, a voltage will be developed on resistor Rs. The voltage opposes the perturbing flux created by the injected current Io, in primary winding Lmp.

Low pass filter 18, summing junction 13, transfer function 14, resistor Rs, and power amplifier PA1 may together form a control loop. The control loop may provide an integral function that may act to restore the average voltage across Rs to be substantially zero. The control loop may generate a readable output voltage Vo on the output of the integrator (in the shown example, Vo may be the voltage at the output of power amplifier PA1 with respect to ground or another fixed potential), which may be indicative of the current sensed by system 10. Output voltage Vo may reflect the amount of voltage needed to cancel the perturbing added by the primary flux of primary winding Lmp. Output voltage Vo maybe represented by the following equation:

$$Vo = \frac{Io \times Rs}{n}$$

The numbers of primary winding Lmp turns may be greater than the number of secondary winding Lns turns.

A higher free-running frequency (fsw) of system 10 may be desired to obtain a good bandwidth of the sensed current, Io. The higher free-running frequency (fsw) can be approximated as, for example:

$$fsw \approx \frac{Rs \times Vcc}{4 \times Vth \times Lm}$$

Where Lm is the magnetizing inductance of core CR, and Vcc may be the supply voltage of system 10. The full excursion of the comparator output may therefore swing from +Vcc/2 to −Vcc/2. The output of the comparator is the output of power amplifier PA2.

Passive circuit Z may provide a higher AC current in transformer T1 in the AC path compared to the AC current in transformer T1 in the AC path when passive circuit Z may be not connected. An example of passive circuit Z may be a series connection of a capacitor and resistor, where the capacitor blocks the flow of DC current but allows the flow of AC current. The higher AC current might not significantly contribute to the DC path of transformer T1. AC current in transformer T1 without passive circuit Z connected may be around 10 milli Amperes (mA), but with passive circuit Z connected, AC current in transformer T1 may be increased to around 30 mA. This may be but one example—any other values of current may be realized with and without passive circuit Z being connected. Consequently, the excitation current of the core CR may be increased by the amount of current drawn by circuit Z. The excitation current may enable core CR to be driven into a saturation state as desired. The saturation may be without the limitation of the cross-sectional area (Ae) of core CR. To enable a low current of current Io to be measured, the minimum cross-sectional area (Ae) of core CR of T1 may be utilized. Reduced cross-sectional area ($Ae_2$ for example) of core CR of T1 compared to area $Ae_1$ for example may be by any circular or polygonal closed form factor implementation of the core CR.

Figure 1G:
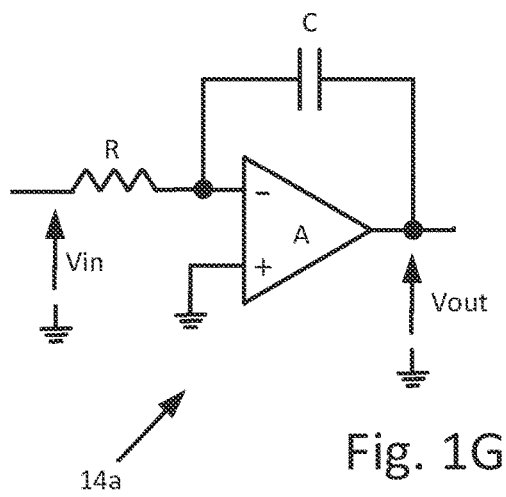
FIG. 1G shows a circuit, according to illustrative aspects of the disclosure.

Reference is now made to FIG. 1G, which shows a circuit 14a, according to illustrative aspects of the disclosure. While certain circuit elements are shown in this figure by way of example, circuit 14a may be implemented using other analogue circuit elements and/or digital circuit elements such as one or more integrated circuits, ASICS, and/or processors, and/or memory storing instructions that can be executed by the one or more processors to perform any of the functionality of circuit 14a. Circuit 14a may be an integrator amplifier which may include an operational amplifier A. Between the output (VAout) of operational amplifier A and the inverting input of operational amplifier A may be connected a capacitor C. Further connected to the inverting input of operational amplifier A is resistor R. The other end of resistor R provides input voltage Vin to circuit 14a with respect to a ground. The ground connects to the non-inverting input of operational amplifier A. The output voltage (VAout) of operational amplifier A may be also with respect to the ground. Mathematically circuit 14a performs the following mathematical equation on the input voltage Vin so that output voltage VAout may be the integral of Vin:

$$VAout = -\frac{1}{RC}\int_0^\tau Vin\, dt$$

Circuit 14a may be utilized to implement transfer function block 14. For example, circuit 14a may implement the integration (I) transfer function of transfer function block 14, where $T_i = -RC$ is the integral time constant, so that a proportional (P), integral (I) function for transfer function 14 may be expressed mathematically by:

$$G_c(S) = \frac{1}{T_i S} = VAout = -\frac{1}{RC}\int_0^\tau Vin\, dt$$

Therefore, with respect to FIG. 1F:

Vin=Vref−Vlpf

A proportional (P), integral (I) function for the transfer function of transfer function block 14 may be expressed mathematically by, for example:

$$G_c(S) = P + I = K_p + \frac{1}{T_i S}$$

Where $K_p$ is the proportional (P) or gain constant and $T_i = -RC$ is the integral (I) time constant. $K_p$ the proportional (P) or gain constant may be realized analogue circuit wise by the gain of amplifier PA1 shown in FIG. 1F. Amplifier PA1 may therefore be included in the proportional (P) part of the transfer function for transfer function block 14 represented by Laplace Transform $G_c(S)$, and circuit 14a may provide the integration (I) of input voltage Vin.

A proportional (P), integral (I), derivative (D) function for transfer function 14 may be expressed mathematically by, for example:

$$G_c(S) = K_p + \frac{1}{T_i S} + T_d S$$

Where $T_d$ is the derivative time constant and may be realized analogue circuit wise by difference amplifier 16, circuit Z, power amplifier PA2 and hysteresis unit 12. As mentioned previously, amplifier PA1 may be included in the proportional (P) part of the transfer function of transfer function block 14 represented by Laplace Transform $G_c(S)$, and circuit 14a may provide the integration (I) of input voltage Vin. Further circuit design implementations of system 10 are described in the descriptions that follow, and the circuit may be designed considering the features of transformer T1 described in greater detail below. The features of transformer may include the effects of the magnetic path lengths and bottlenecks of the cores used to implement embodiments of transformer T1.

Figure 1H:
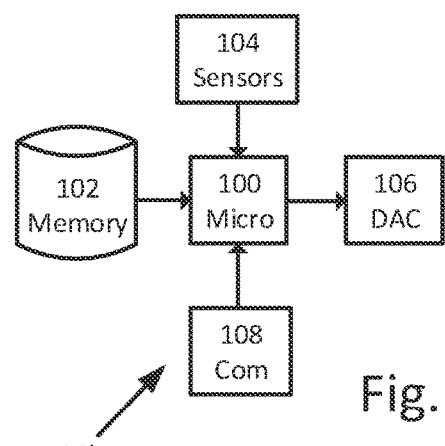
FIG. 1H a control unit, according to illustrative aspects of the disclosure.

Reference is now made to FIG. 1H, which shows a control unit 14b according to illustrative aspects of the disclosure. Circuit 14b may implement the integral function to the proportional/integral/derivative (PID) control function of transfer function block 14 in control system 10. In addition to or as a substitute for one or more of the elements shown in closed feedback loop 19, closed feedback loop 19 may include one or more processors such as processor 100 (e.g., a microprocessor), memory 102 operatively attached to the processor 100, sensors/sensor interface 104 and a communications interface 108. Processor 100 may therefore in general sense one or more parameters of system 10 via analogue to digital converters (ADCs) which may be included in sensor(s)/sensor interface 104. Specifically, a control algorithm may be performed by processor 100 (in accordance with instructions stored by memory 102) to configure and control system 10 to implement a proportional/integral/derivative (PID) control function to sense a current Io. The control algorithm, if implemented on processor 100, may utilize a function $G_c(Z)$ for transfer function 14. Z in the function $G_c(Z)$ is the Z operator to provide a discrete-time equivalent of the continuous time function of function $G_c(S)$, where S is the Laplacian operator. Therefore, function $G_c(Z)$ for transfer function 14 may be appropriate for a digital implementation of system 10 using microprocessor 100 and communications interface 108. More specifically, the control algorithm may be responsive to the features of transformer T1 described in greater detail below. The features of transformer T1 may include the effects of the lengths of magnetic path (paths P1 and P2 for example) and bottlenecks of the cores used to implement embodiments of transformer T1.

Reference is made to FIG. 2, which shows a circuit diagram of system 10b according to illustrative aspects of the disclosure. System 10b may be an example of system 10 as shown in FIG. 1 and may have analogous elements with FIG. 1F and may have elements implemented interchangeably. As an example of analogous elements of FIG. 1F and FIG. 2, the diode unit D may be used as an implementation of hysteresis unit 12, Ca and Ra may be used as an implementation of a passive circuit or a resistive circuit Z, and amplifier A2 may be used as an implementation of difference amplifier 16. Analogue sensor circuit 1000b may be implementation of sensor circuit 1000 shown in shown in FIG. 1. Transformer T1 may include a primary winding Lmp and a secondary winding Lns through which a secondary current Is may flow. Primary winding Lmp of 'm' turns and a secondary winding Lns of 'n' turns may be wound on a core CR. Core CR electromagnetically couples primary winding Lmp to secondary winding Lns. Core CR (which may be the same cores shown in FIGS. 1A-1E) may be made from one or more ferromagnetic and/or ferrimagnetic materials, which may include materials such as iron, nickel, cobalt manganese, zinc and their alloys. Inductances and other properties of primary winding Lmp and secondary winding Lns may vary according to changes in levels of the current in the windings. Thus, when a measured current (Io) may be injected into primary winding Lmp, a voltage will be developed on secondary winding Lns. The voltage may oppose the perturbing flux created by the current (Io), in primary winding Lmp.

In the shown example, a first side of secondary winding Lns connects to first sides of resistors Rt, Rs, Ra and to the inverting input (−) of amplifier A2. A second end of resistor Rt connects to a first end of capacitor Ct and to the inverting input (−) of amplifier A1. A second end of capacitor Ct connects to the output of amplifier A1 and a second end of resistor Rs. The non-inverting terminal (+) of amplifier A1 connects to ground. The output of amplifier A1 may provide the output voltage Vo of sensor circuit 1000b with respect to ground. Amplifier A1, capacitor Ct, and resistors Rt and Rs and their connections show a loop 19a which may be a component realization of closed feedback loop 19 described above. Similarly, amplifier A2, resistor R and diode unit D may be a component realization of difference amplifier 16, power amplifier PA2 and hysteresis unit 12 described above. A second end of resistor Ra connects to a first end of capacitor Ca and a second end of capacitor Ca connects to ground. Similarly, resistor Ra and capacitor Ca connected together as shown may be a component realization of a passive circuit or a resistive circuit described above, such as circuit Z in FIG. 1F. A diode unit D connects between ground and the non-inverting input terminal (+) of amplifier A2. Diode unit D may include two diodes connected in parallel. The anode of a first diode connects to the cathode of a second diode at one end of diode unit D. Similarly, at the other end of diode unit D, the anode of the second diode connects to the cathode of the first diode. A resistor R may connect between the output of amplifier A2 and the non-inverting input terminal (+) of amplifier A2. A second end of secondary winding Lns connects to the output of amplifier A2.

Transformer T1 may include magnetic core CR which includes primary winding Lmp of 'm' turns and a secondary winding Lns of 'n' turns. In general, the number of 'n' turns may be greater than the number of 'm' turns, where by way of non-limiting example for descriptions that follow, 'm' may be one turn on primary winding Lmp. The number of "n" may be any value. The number of "m" may be any value that may be smaller than "n". For example, m may be equal to or greater than one, and n may be equal to or greater than 2 and also greater than m. One turn on primary winding Lmp may involve insertion of a conductor through the aperture of core CR. Capacitor Ct, resistor Rt and amplifier A1 may perform an integral function where the time constant is set by capacitor Ct and resistor Rt. Resistor Ra and capacitor Ca provide an alternating current (AC) current path which increases current through secondary winding Lns. Resistor Ra and capacitor Ca may be an example of circuit Z described above. Details will be described below. The alternating current (AC) current increase through secondary winding Lns may be by additional AC current flow through a current path including resistor Ra and capacitor Ca to ground. Capacitor Ca blocks DC current flow and substantially only allows AC current flow to ground. Diode unit D with resistor R may provide a symmetrical threshold setting of amplifier A2 which may function as a comparator. The slope of the current versus time through the secondary winding Lns may be sensed through resistor Rs which serves as shunt resistor to the input of the comparator.

In descriptions that follow, a feature of systems 10 which may include sensor circuits 1000 described above, is a difference between cross sectional areas and magnetic path lengths. As shown in FIGS. 1A-1E, the difference may be of a first part of the core of transformer T1 and a second part of the core of transformer T1. The difference being that the first part may include the cross-sectional areas and magnetic path lengths of arms As1, As1c, As1d, As2, As2a, As2b, As3, As3c, As3d/path P1. The second part may include the cross-sectional area and magnetic path lengths of arms As4, As4a, As4b, As4c/path P2. In this respect, the difference may be referred to as the 'bottleneck' of the core of transformer T1. The bottleneck may include arms As4, As4a, As4b, As4c/path P2 which are described above and below by way of non-limiting example.

Figure 3:
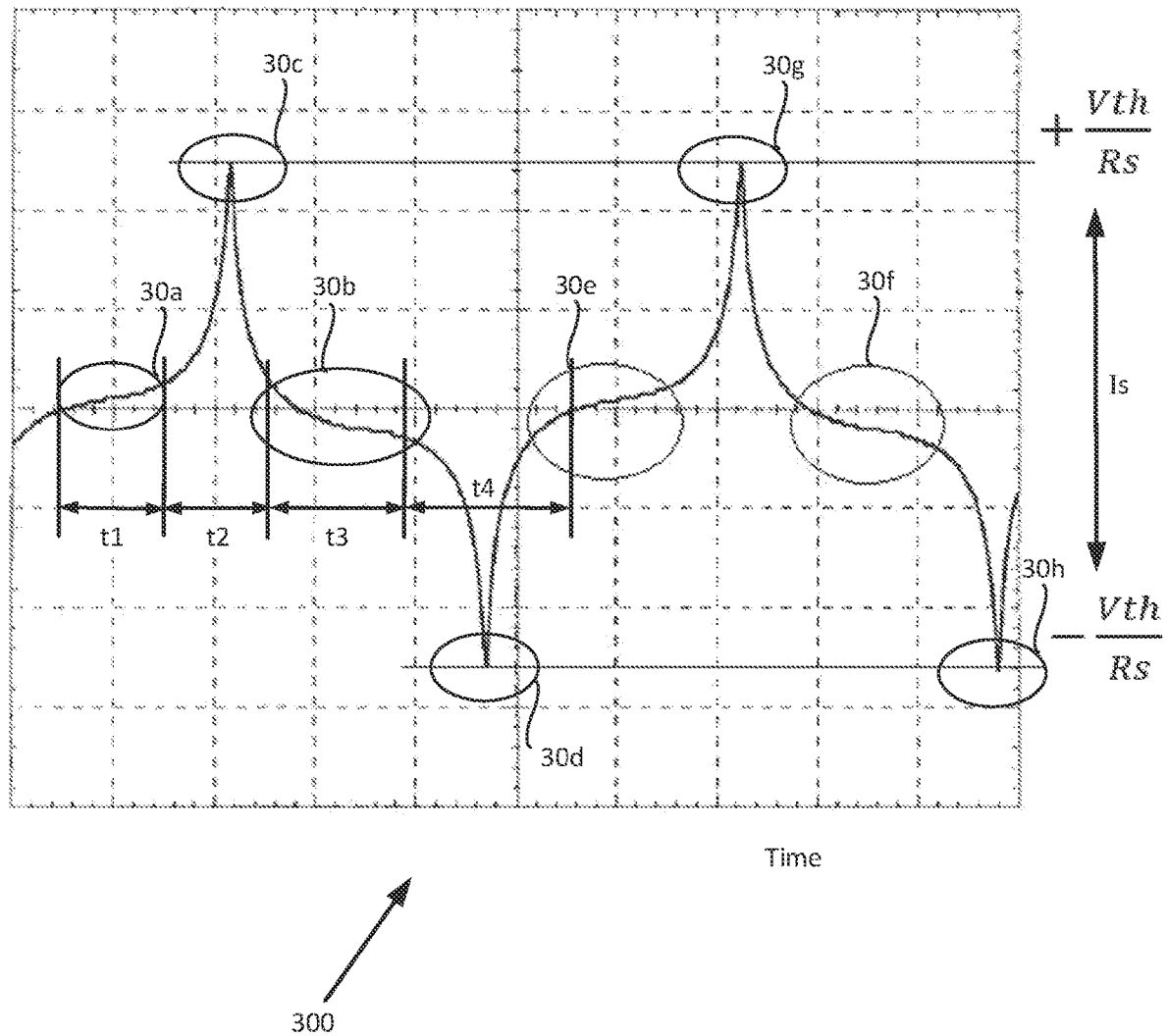
FIG. 3 shows a graph, according to illustrative aspects of the disclosure.

Reference is now made again to FIG. 2, and to FIG. 3 which shows a graph 300, according to illustrative aspects of the disclosure. Graph 300 shows (not to scale) a representative plot of secondary current Is of transformer T1 versus time in accordance with an example operation of circuit 1000b. In operation of circuit 1000b, secondary current Is through secondary winding Lns starts increasing substantially linearly as shown by area 30a over time period t1 and the flux (Φ) through core CR increases accordingly. The secondary current Is peak through the secondary winding Lns is shown by area 30c over time period t2. The secondary current Is and the flux (Φ) through core CR decreases accordingly as shown by area 30b over time period t3. The reverse current Is peak through the secondary winding Lns may be shown by areas 30d over time period t4. Similar substantially linear increase and decrease in secondary current Is and the flux (Φ) through core CR by areas 30a and 30b is shown respectively by areas 30e and 30f. Similar peak and reverse peak secondary current Is to areas 30c and 30d are shown respectively by areas 30g and 30h.

The maximal magnetic flux density ($\Phi_B$) is inversely proportional to the core CR area (Ae), and may be at maximum in the bottleneck of core CR. When core CR starts to saturate at the bottleneck area of core CR, the inductance of the whole structure of secondary winding Lns may be sharply decreased. The sharp decrease in the inductance in turn increases the slope of the current versus time shown in time period t2 to give a current peak through the secondary winding Lns. The secondary current Is and the reverse secondary current Is peaks through the secondary winding Lns are shown respectively by areas 30c, 30g and 30d, 30h of graph 300.

Diode unit D with resistor R may provide a symmetrical or an asymmetrical threshold setting of amplifier A2 which functions as a comparator. The slope of secondary current Is versus time through the secondary winding Lns may be sensed through resistor Rs which serves as a shunt resistor to the input of the comparator. A threshold voltage Vth may be defined as the product of secondary current Is and resistor Rs. When threshold voltage Vth reaches the setup threshold ±Vth, the comparator changes its output sharply and the current through the secondary winding Lns changes position in the same manner but with the opposite direction of current flow. In this way the comparator oscillates at the free running frequency (fsw) discussed previously that may be determined by threshold voltages ±Vth set by diode unit D.

When no measured current Io is flowing through primary winding Lmp, the average voltage developed on resistor Rs may be substantially zero. Core CR flux density saturates freely between +Bsat to −Bsat at a symmetrical duty cycle of 50%, since the saturation of the core CR may be substantially symmetric in magnitude. Once a perturbing (measured) current Io is injected to the primary winding Lmp, a voltage will be developed on resistor Rs. The voltage opposes the perturbing flux created by the injected current Io in primary winding Lmp. Amplifier A1, which may be connected as an integrator, may act to restore the average voltage on Rs to be substantially zero. A readable output voltage Vo on the output of amplifier A1 may be indicative of the current sensed by sensor circuit 1000b. Output voltage Vo may reflect the amount of voltage needed to cancel the perturbing added primary flux of primary winding Lmp. Output voltage Vo is proportional to resistor Rs and inversely proportional to turns number "n" of secondary winding Lns.

The free-running frequency (fsw) of circuit 1000b may be selected to obtain a particular desired bandwidth of the sensed current, Io. Self-oscillating frequency (fsw) can be approximated as:

$$f_{sw} \approx \frac{Rs \times Vcc}{4 \times Vth \times Lm}$$

Lm is the magnetizing inductance of core CR and Vcc may be the supply voltage of circuit 1000b. The full excursion of amplifier A2 output therefore swings from +Vcc/2 to −Vcc/2.

The resistor Ra and capacitor Ca network may provide a higher current in transformer T1 in the AC path but will not contribute to the DC path of transformer T1. Consequently, the DC transfer function Vo/Io is unchanged but the excitation current of the core CR may be increased by the amount of Vcc/Ra. The excitation current may enable core CR to be driven into saturation as desired which may be without the limitation of the cross-sectional area Ae2 of core CR.

To enable a low value of current Io to be measured, the minimum cross-sectional area (Ae) of core CR of T1 may be utilized. Minimum cross-sectional area (Ae) of core CR of T1 may be by any circular closed form factor of the core CR. At some place along the magnetic path of core CR a bottleneck may be inserted.

Figure 4:
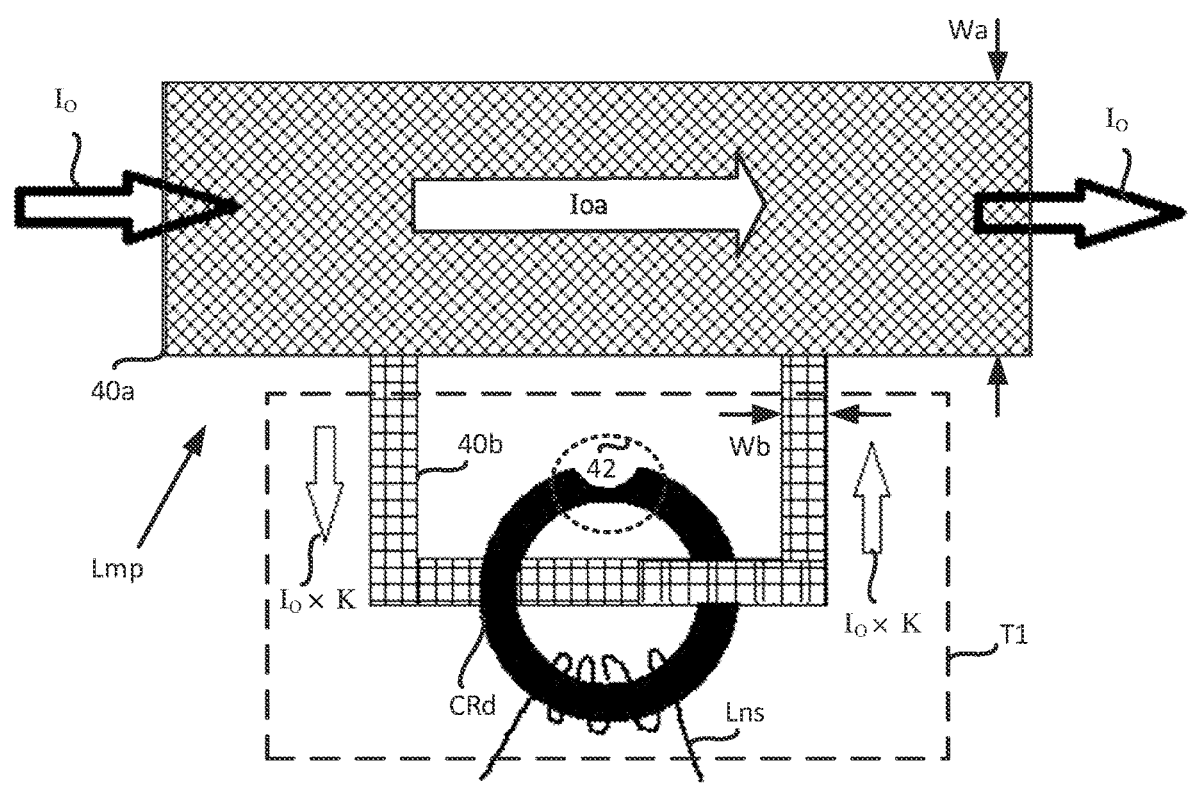
FIG. 4 shows an arrangement of a primary winding used to sense current, according to illustrative aspects of the disclosure.

Reference is now made to FIG. 4, which shows a way of implementing primary winding Lmp (for any of the other examples described herein with regard to any of the figures) used to sense current Io, according to illustrative aspects of the disclosure. The implementation of primary winding Lmp includes conductors 40a and 40b. Conductor 40b connects in parallel across conductor 40a. Width Wa of conductor 40a may be greater than width Wb of conductor 40b. Conductor 40b, which may be considered a single turn of primary winding Lmp, passes through core CRd. Core CRd is, in this example, a circular toroidal core which includes a bottleneck 42. Core CRd may be used to implement the core for any of the examples described herein for any of the figures, such as the core CR for FIG. 1F or 1B. Secondary winding Lns may be shown wrapped around core CRd with "n" turns. According to Kirchhoff's Law, current Io is given by:

Io=Ioa+(Io×K)

Where boa is the current flowing in conductor 40*a*, and the current flowing in conductor 40*b* is current boa multiplied by a factor K. The factor K may be an indication of the higher resistivity (ρb) value of conductor 40*b* compared to the lower resistivity (ρa) value of conductor 40*a* such that given the general equation for resistivity (ρ) is:

$$\rho = R\frac{A}{l}$$

Where R is the electrical resistance of a uniform specimen of the conductor material, l is the length of the piece of conductor material and A is the cross-sectional area of the conductor material.

K may be defined in terms of the currents and the physical/electrical properties of the conductors $$K = 1 - \frac{Ioa}{Io}$$

Current boa multiplied by a factor K is such that the amount of current flowing in conductor 40*b* may be less than the current flowing in conductor 40*a*. The amount of current flowing in conductor 40*b* may be less than the current flowing in conductor 40*a* because the cross-sectional area (Ab) of conductor 40*b* may be less than the cross-sectional area (Aa) of conductor 40*a*. The cross-sectional area (Ab) of conductor 40*b* being less than the cross-sectional area (Aa) of conductor 40*a* means that conductor 40*b* has a greater resistivity (ρb) ohm metre (Ωm) than the resistivity (ρa) ohm metre (Ωm) of conductor 40*a*. Therefore, more current will flow in conductor 40*a* compared to conductor 40*b*. Assuming that each conductor (such as conductor 40*a*) is rectangular and has the same material and depth (d), the length of conductor 40*a* is la and the length of conductor 40*b* is lb. Resistivity ($\rho_a$) of conductor 40*a* is:

$$\rho_a = Ra\frac{Wa \times d}{la}$$

Resistance Ra is:

$$Ra = \frac{\rho_a \times la}{Wa \times d}$$

Resistivity ($\rho_a$) of conductor 40*b* is:

$$\rho_b = Rb\frac{Wb \times d}{lb}$$

Resistance Rb is:

$$Rb = \frac{\rho_b \times lb}{Wb \times d}$$

The current flowing in conductor 40*b* being less than the current flowing in conductor 40*a* may allow measurement of high values of current Io. The major part of current Ioa may be diverted out of the core CR via conductor 40*a* and instead core CR being subject only to a known factor K of the measured current (Io) via conductor 40*b*. A printed circuit board (PCB) implementation of primary winding Lmp may include conductors 40*a* and 40*b*. Conductors 40*a* and 40*b* may be PCB tracks with respective widths Wa and Wb where width of Wa may be greater than width Wb. By way of non-limiting example, conductors 40*a* and 40*b* may also be implemented as two parallel bus-bars, with similar cross-sectional shape with the same length (la=lb) and depth (d) but where the width of Wa of one bus-bar may be greater than the width Wb of the second bus-bar, to allow greater current through conductor 40*a* compared to that of conductor 40*b*. A bus-bar may be embodied as, for example, a metallic strip or bar, which may be used for high current power distribution.

By way of non-limiting example, assume the maximum current Io to be measured is 1 ampere (A). Assuming that the maximum current for Ioa is 1 milli ampere (mA). The factor K is:

$$K = 1 - \frac{10 \times 10^{-3}}{100} = 0.01$$

Resistances Ra and Rb are connected in parallel so the voltage (V) across Ra and Rb is the same. In terms of the physical and electrical parameters of conductors 40*a* and 40*b*, factor K may be related therefore to the resistances Ra/Rb (electrical parameters) and the depth (d), width (W) of conductors 40*a* and 40*b* in the equations above and those below:

$$Io \times K = \frac{V}{Rb}$$

$$Ioa = \frac{V}{Ra}$$

$$Io = \frac{V \times (Ra + Rb)}{Ra \times Rb}$$

$$K = \frac{Ioa \times Ra}{Io \times Rb}$$

Given that for a copper PCB track implementation of conductors 40*a* and 40*b*, assume for example that d=0.035 milli-metres (mm) and ρa=ρb=17.2 nano ohm (nΩ) metres. For a factor, assume for example that K=0.01, Ra=4.42 µΩ, Wa=10 mm, la=90 mm and Rb=39.842µΩ, Wb=2.22 mm and lb=180 mm.

For a two bus-bar copper implementation of conductors 40*a* and 40*b*, assume for example that d=1 mm and ρa=ρb=17.2 nΩ metres. For a factor, assume for example that K=0.01, Ra=0.774 µΩ, Wa=20 mm, la=lb=90 mm, Rb=0.697 µΩ, Wb=2.22 mm. Implementation of conductors 40*a* and 40*b* and other conductors below may be a combination of two PCB tracks, combination of two bus-bars or a PCB track and bus-bar/electrical cable. It will be understood that other values may be used for any of the above-discussed parameters.

Figure 5A:
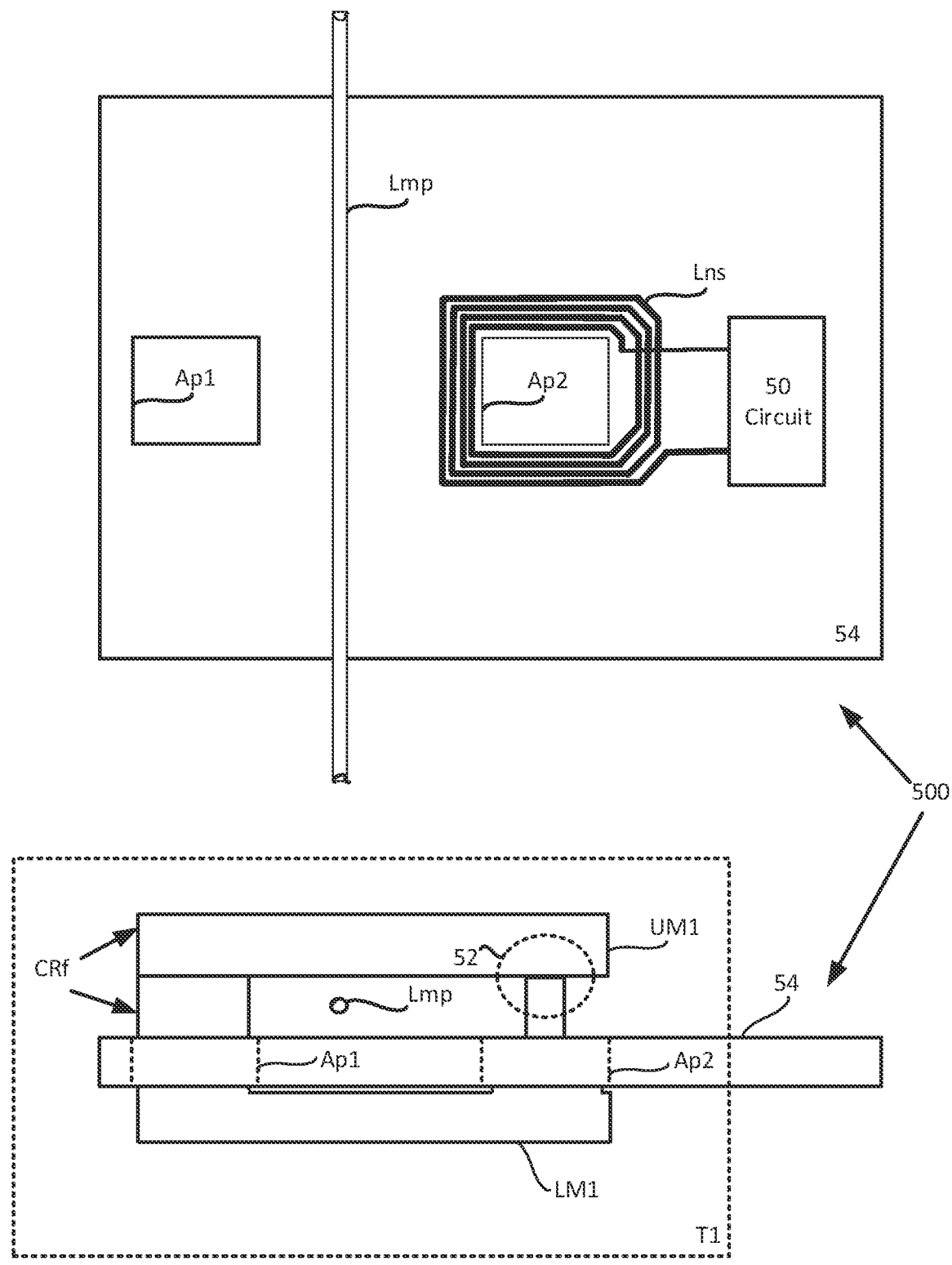
FIG. 5A shows plan view and side view drawings of a printed circuit board (PCB) implementation of a secondary winding, according to illustrative aspects of the disclosure.

Reference is now made to FIG. 5A, which shows plan and sideview drawings 500 of a printed circuit board (PCB) 54 implementation of secondary winding Lns, according to illustrative aspects of the disclosure. The plan view includes a circuit 50 which connects to a planar implementation of secondary winding Lns. Circuit 50 may include the components of sensor circuits 1000a and 1000b which similarly connect to secondary winding Lns shown respectively in FIGS. 1F and 2. The components of circuit 50 may interconnect with each other by utilizing connections such as pads and tracks provided on PCB 54. The components of circuit 50 may be an external circuit which may be pluggable into a connector provided on PCB 54 (not shown). The planar implementation of secondary winding Lns shows a planar coil of "n" PCB tracks that wrap around an aperture Ap2. The planar coil may be shown as substantially square in shape, as are apertures Ap1 and Ap2. In general, both the planar coil and/or apertures may be may be any regular or irregular shape, for example, substantially rectangular, substantially elliptical, substantially spherical, substantially triangular, substantially pentagon or any polygon shape. Primary winding Lmp may be shown disposed between apertures Ap1 and Ap2. A similar aperture Ap1 may be also provided in and through PCB 54 which may be laterally opposite to aperture Ap2.

The use of apertures Ap1 and Ap2 in the formation of transformer T1 may be shown with respect to the side view. The side view shows core CRf in situ on PCB 54. Core CRf may be used to implement the core for any of the examples described herein for any of the figures, such as the core CR for FIGS. 1A-1E. Core CRf in this example may be made of an upper member UM1 and a lower member LM1. Upper member UM1 and lower member LM1 may both include two arms each which are joinable at their respective cross sections through apertures Ap1 and Ap2, through aperture Ap1 or AP2 alone or not through aperture Ap1 or AP2. The two joinable parts joined together form the magnetic path through core CRf. After insertion of lower member LM1 through apertures Ap1 and Ap2, lower member LM1 may be attached to upper member UM1 using an adhesive and/or another mechanism that clamps lower member LM1 to upper member UM1. Alternatively, or in addition, a clamp may clamp lower member LM1 to upper member UM1 and/or clamp core CRf in situ on PCB 54 as shown. Primary winding Lmp may be shown disposed between apertures Ap1 and Ap2 in the aperture of core CRf formed as a result of lower member LM1 being clamped and/or attached to upper member UM1. The attachment of lower member LM1 to upper member UM1 forms the bottleneck 52 of core CRf.

Figure 5B:
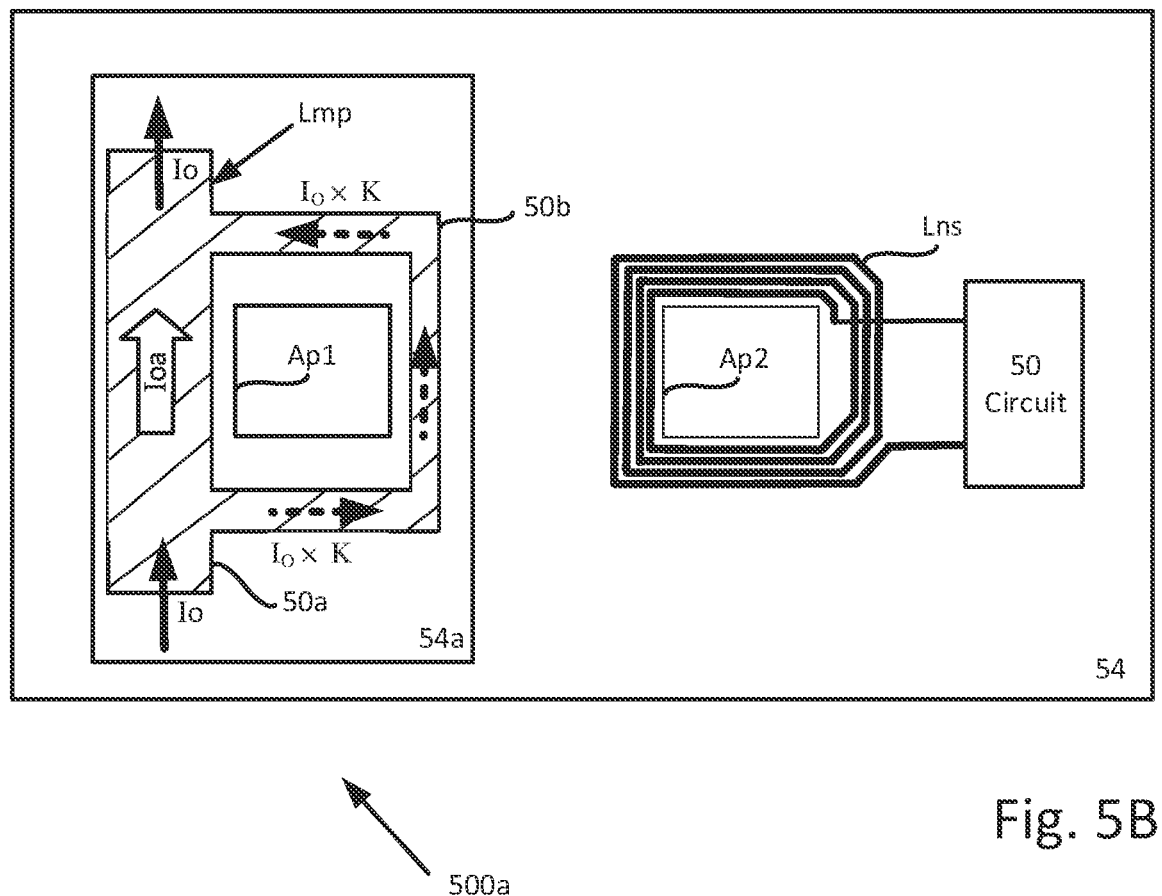
FIG. 5B shows a plan view drawing of a printed circuit board showing an implementation of primary winding, according to illustrative aspects of the disclosure.

Reference is now made to FIG. 5B, which shows a plan view drawing 500a of printed circuit board (PCB) 54 showing an implementation of primary winding Lmp, according to illustrative aspects of the disclosure. Printed circuit board 54 may be the same printed circuit board as shown in FIG. 5A, where secondary winding Lns may be similarly implemented as per the side view of FIG. 5A but is not shown in order to more clearly explain the features of an implementation for primary winding Lmp. Primary winding Lmp allows the measurement of high current for current Io and may be implemented on a printed circuit board (PCB) 54a. Printed circuit board (PCB) 54a may be an integral part of PCB 54. Conductor 50b connects in parallel across conductor 50a in which both conductors 50a and 50b may be implemented as PCB tracks of printed circuit board 54a as shown by the hashed lines. Alternatively, or in addition, conductor 50a may be implemented as a bus-bar and may be mounted and connected to conductor 50b which may be a PCB track of PCB 54a. The width of conductor 50a may be greater than the width of conductor 50b as shown. Conductor 50b may be a single turn of primary winding Lmp which passes through core CRf. By virtue of conductor 50a having a greater track width than the track width of conductor 50b, current Io according to Kirchhoff's Law is given by:

$$Io = Ioa + (Io \times K)$$

Where boa is the current flowing in conductor 50a and the current flowing in conductor 50b is current boa multiplied by a factor K. The current flowing through conductor 50b may be less than the current flowing through conductor 50a. Less current in conductor 50b may be a result of the cross-sectional area and/or the track width of conductor 50b being less than the cross-sectional area and/or track width of conductor 50a. Similar to the previous discussions in connection with FIG. 4, the lower current flowing in conductor 50b may allow the sensing of the high current of current Io.

Figure 6A:
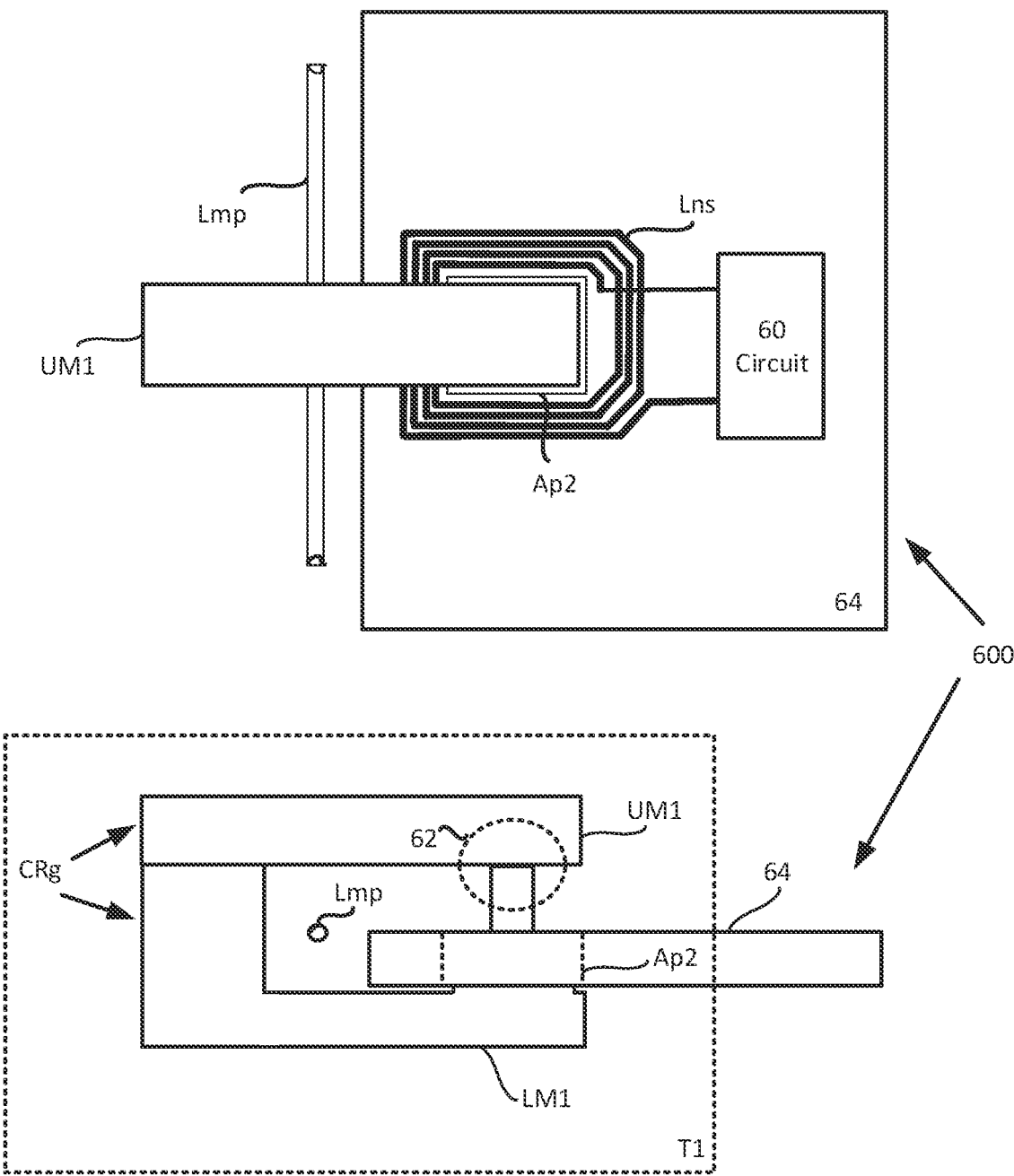
FIG. 6A shows plan view and side view drawings of a printed circuit board (PCB) implementation of a secondary winding and a core, according to illustrative aspects of the disclosure.

Reference is now made to FIG. 6A, which shows a plan and sideview drawing 600 of a printed circuit board (PCB) 64 implementation of secondary winding Lns and core CRg, according to illustrative aspects of the disclosure. Core CRg in FIG. 6A or FIG. 6B may be used to implement the core for any of the examples described herein for any of the figures, such as the core CR for FIG. 1F or 1B. The plan view includes a circuit 60 which may be similar to circuit 50 which connects to a planar implementation of secondary winding Lns. Circuit 60 may include the components of, for example, circuits 1000a and 1000b that similarly connect to secondary winding Lns shown respectively in FIGS. 1F and 2. The planar implementation of secondary winding Lns shows a planar coil of "n" PCB tracks which wrap around an aperture Ap2. The planar coil may be shown as substantially square in shape as is aperture Ap2. In general, both the planar coil and/or aperture may be rectangular, elliptical, spherical, triangular, pentagon and/or any polygon shape. Unlike PCB 54, PCB 64 only has one aperture Ap2 through which the bottleneck 62 of core CRg inserts through. The other portion of core CRg may be outside of PCB 64.

Primary winding Lmp may be shown as a single conductor (with spherical cross section) inserted through the aperture of core CRg. Where primary winding Lmp may be implemented as a track on a PCB, the positioning of the track may be laterally to the side of planar implementation of secondary winding Lns or may be above or below secondary winding Lns. The track may also be oriented to have the same orientation as the planar implementation of secondary winding Lns and/or be perpendicular to the secondary winding Lns.

The use of aperture Ap2 in the formation of transformer T1 may be shown with respect to the side view. The side view shows core CRg in situ on PCB 64. Core CRg may be made of an upper member UM1 and a lower member LM1. Upper member UM1 and lower member LM1 may be two joinable parts with bottleneck 62 joined together through apertures Ap2 to form the magnetic path through core CRg. After insertion of lower member LM1 through aperture Ap2, lower member LM1 may be attached to upper member UM1 using an adhesive and/or another mechanism that clamps lower member LM1 to upper member UM1. Alternatively, or in addition a clamp may clamp lower member LM1 to upper member UM1 and/or clamp core CRg in situ on PCB 64 as shown. Primary winding Lmp may be shown with bottleneck 62 in aperture Ap2 of core CRg formed as a result of lower member LM1 being clamped and/or attached to upper member UM1. The attachment of lower member LM1 to upper member UM1 forms the bottleneck 62 of core CRg.

Figure 6B:
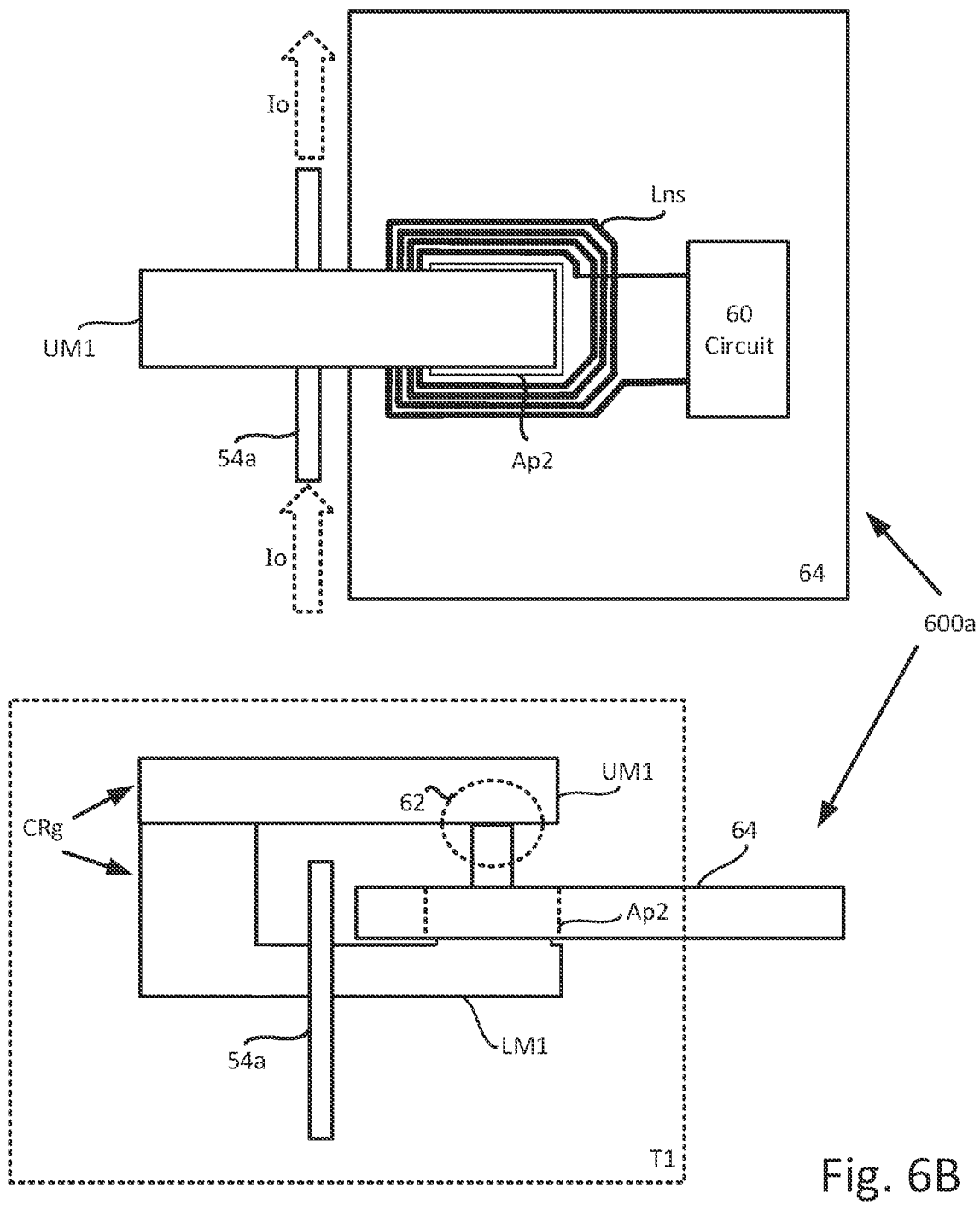
FIG. 6B shows plan view and side view drawing of a printed circuit board (PCB) implementation of a secondary winding, according to illustrative aspects of the disclosure.

Reference is now made to FIG. 6B, which shows a plan and sideview drawing 600a of a printed circuit board (PCB) 64 implementation of secondary winding Lns, according to illustrative aspects of the disclosure. PCB 54a as discussed above may be an implementation of primary winding Lmp for the measurement of high current by utilization of conductors/PCB tracks 50a and 50b. By virtue of conductor 50a having a greater track width than the track width of conductor 50b, current Io according to Kirchhoff's Law is given by:

$$Io = Ioa + (Io \times K)$$

The factor K may be an indication of the higher resistivity (ρb) value of conductor 50b compared to the lower resistivity (ρa) value of conductor 50a such that given the general equation for resistivity (ρ) is:

$$\rho = R\frac{A}{l}$$

K may be defined in terms of the currents in each of conductors 50a and 50b.

$$K = 1 - \frac{Ioa}{Io}$$

Where boa is the current flowing in conductor 50a and the current flowing in conductor 50b is current boa multiplied by a factor K. The amount of current flowing in conductor 50b may be less than the current flowing in conductor 50a. Factor K may be related therefore to the resistances Ra/Rb (electrical parameters) and the depth (d), width (W) of conductors 50a and 50b in the same way for the equations above with respect to conductors 40a and 40b.

The positioning of the tracks to implement conductors 50a and 50b may be laterally to the side of planar implementation of secondary winding Lns and/or be above or below secondary winding Lns. Conductors 50a and 50b may also be oriented to have the same orientation as the planar implementation of secondary winding Lns as shown in FIG. 5B or may be perpendicular to the secondary winding Lns as shown in FIG. 6B. Disposing secondary winding Lns perpendicular to conductors 50a and 50b may also provide increased sensitivity. The increased sensitivity may be compared in reference to conductors 50a and 50b oriented to have the same orientation as the planar implementation of secondary winding Lns as shown in FIG. 5B.

Sensitivity may be lost with the two-part cores like CRf and CRg when compared to the sensitivity of the single part cores described above, because of the air gap between upper member UM1 and lower member LM1. Whilst loss of sensitivity may be less desirable, a possible solution may be to wind more turns 'n' on secondary winding Lns. However, increasing turns 'n' on secondary winding Lns may result in reduced resolution (Rs/n) of measured current Io. Further, the magnetizing inductance Lm of cores CR with "n" windings may increase by $n^2$. Increasing the magnetizing inductance Lm, may however, lower the free running frequency (fsw) and consequently lower the bandwidth of measurement of current Io.

Lack of or reduction in sensitivity in either case of a single and/or two-part core may be compensated for by use of the resistor Ra and capacitor Ca (e.g., an example circuit Z). Resistor Ra and capacitor Ca network may provide an increase in the AC excitation current through secondary winding Lns as an alternative to winding more turns 'n' on secondary winding Lns. The increase in the AC excitation current through secondary winding Lns may help improve both single and/or two-part core gapped cores (like cores CRc/CRf/CRg for example) being driven into saturation. Therefore, cores driven into saturation as described above might not have decreasing resolution and bandwidth of measured current Io. The excitation current (AC) flows by virtue of resistor Ra and capacitor Ca connected to ground to increase AC current through secondary winding Lns. Capacitor Ca substantially blocks DC current flow and only allows AC current flow to ground. The AC excitation current may now be determined by resistor Rs in parallel with resistor Ra while the desired DC transfer function (Vo/Io) may remain as Rs/n.

It may be noted that various connections are set forth between elements herein. These connections are described in general and, unless specified otherwise, may be direct or indirect; this specification is not intended to be limiting in this respect. Further, elements of one example may be combined with elements from other examples in appropriate combinations or sub-combinations.

All features and modifications of the described examples are usable in all aspects and examples taught herein.

The invention claimed is:

1. A sensor circuit comprising:
   a comparator connected to a first terminal of a winding;
   a passive circuit comprising a resistor and a capacitor, wherein the resistor and capacitor are connected in series, wherein the passive circuit is connected, at a first end, to a first input of the comparator and, at a second end, to a fixed potential;
   a feedback loop connected to a second terminal of the winding and the first input of the comparator; and
   a hysteresis unit connected to a second input of the comparator.

2. The sensor circuit of claim 1, wherein the hysteresis unit comprises a plurality of diodes.

3. The sensor circuit of claim 1, wherein the hysteresis unit is connected to the fixed potential.

4. The sensor circuit of claim 1, wherein the fixed potential is ground.

5. The sensor circuit of claim 1, wherein the first input of the comparator is a negative input and the second input of the comparator is a positive input.

6. The sensor circuit of claim 1, wherein the comparator is configured to operate at a free running frequency.

7. The sensor circuit of claim 1, further comprising:
   a transformer comprising:
      a core;
      a primary winding; and
      a secondary winding, wherein the winding comprises the secondary winding of the transformer.

8. The sensor circuit of claim 7, wherein the primary winding is configured to carry a direct current and an alternating current.

9. The sensor circuit of claim 7, wherein the primary winding is configured to sense at least one of: a differential current flow or a common mode current flow.

10. The sensor circuit of claim 7, wherein a number of turns of the secondary winding is greater than a number of turns of the primary winding.

11. The sensor circuit of claim 7, wherein at least one turn of the primary winding passes through an aperture of the core.

12. The sensor circuit of claim 7, wherein the primary winding comprises a first conductor,
   wherein the first conductor is connected in parallel with a second conductor, and wherein the first conductor passes through an aperture of the core, and the second conductor does not pass through the aperture of the core.

13. The sensor circuit of claim 12, wherein current is divided between the first conductor and the second conductor, and a resistivity of the first conductor is greater than a resistivity of the second conductor.

14. The sensor circuit of claim 12, further comprising a circuit board, wherein either or both of the first conductor and the second conductor comprises either a printed circuit board track of the circuit board or a bus-bar connected to the circuit board.

15. The sensor circuit of claim 7, wherein the core comprises a plurality of magnetic paths, the plurality of magnetic paths comprising:
- a first magnetic path having a first length and a first cross-sectional area; and
- a second magnetic path having a second length and a second cross-sectional area.

16. The sensor circuit of claim 15, wherein the second length is less than the first length and the second cross-sectional area is less than the first cross-sectional area.

17. The sensor circuit of claim 15, wherein the core comprises a plurality of arms, wherein the plurality of arms form an aperture of the core, and the plurality of arms comprises at least one arm that is part of the first magnetic path and at least one other arm that is part of the second magnetic path.

18. The sensor circuit of claim 15, wherein a portion of the core that is part of the second magnetic path comprises a cross section narrowed by a radius.

19. The sensor circuit of claim 15, wherein ends of the first magnetic path are adjacent to ends of the second magnetic path, the first magnetic path and the second magnetic path encircling an aperture of the core.

* * * * *